United States Patent
Ohkawa

(10) Patent No.: US 7,732,846 B2
(45) Date of Patent: Jun. 8, 2010

(54) SEMICONDUCTOR DEVICE INCLUDING SOLID STATE IMAGE PICKUP DEVICE, AND PORTABLE ELECTRONIC APPARATUS

(75) Inventor: Narumi Ohkawa, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/399,517

(22) Filed: Mar. 6, 2009

(65) Prior Publication Data

US 2009/0321800 A1 Dec. 31, 2009

(30) Foreign Application Priority Data

Jun. 26, 2008 (JP) .............................. 2008-167619

(51) Int. Cl.
*H01L 21/762* (2006.01)
(52) U.S. Cl. ................ 257/292; 257/440; 257/E21.127
(58) Field of Classification Search ................ 257/291, 257/292, 293, 294, 435, 440, 365
See application file for complete search history.

(56) References Cited

U.S. PATENT DOCUMENTS 5,506,430 A * 4/1996 Ohzu .......................... 257/292
7,382,010 B2 6/2008 Choi
2007/0201114 A1 * 8/2007 Egawa ........................ 358/513

FOREIGN PATENT DOCUMENTS

JP 2006-165567 A 6/2006

* cited by examiner

*Primary Examiner*—Roy K Potter
(74) *Attorney, Agent, or Firm*—Westerman, Hattori, Daniels & Adrian, LLP

(57) ABSTRACT

A semiconductor device includes: a plurality of pixel units disposed in a matrix shape, each of the plurality of pixel units including: a first photoelectric conversion element for converting incident light of a first color into signal charges; a second photoelectric conversion element for converting incident light of a second color into signal charges; a third photoelectric conversion element for converting incident light of a third color into signal charges; and a detector circuit shared by the first to third photoelectric conversion elements for detecting the signal charges converted by each of the first to third photoelectric conversion elements, wherein the plurality of pixel units are pixel units adjacently disposing a row (column) juxtaposing the first photoelectric conversion element and detector circuit and a row (column) juxtaposing the second and third photoelectric conversion elements.

16 Claims, 25 Drawing Sheets

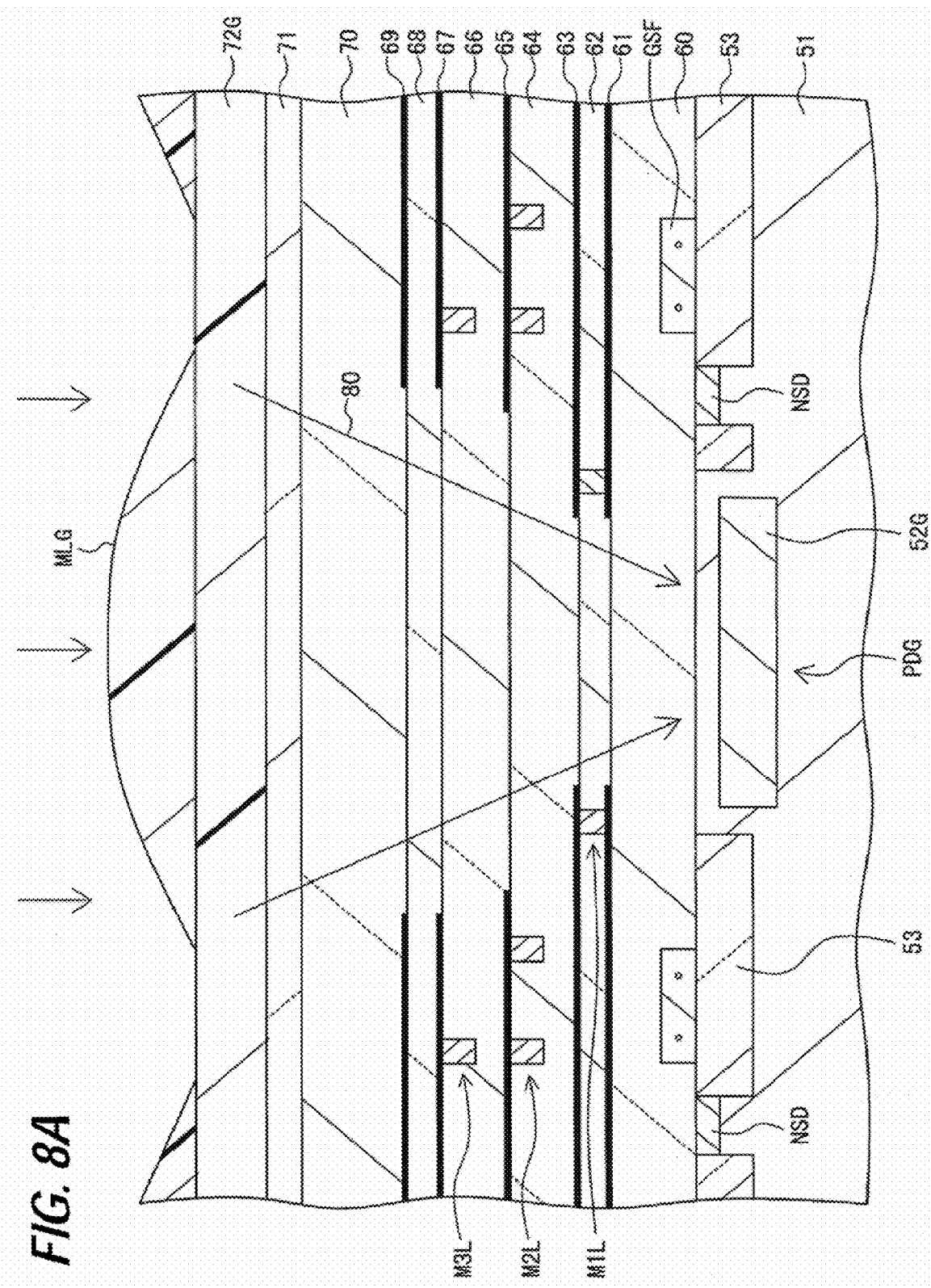

SEMICONDUCTOR DEVICE INCLUDING SOLID STATE IMAGE PICKUP DEVICE, AND PORTABLE ELECTRONIC APPARATUS

CROSS-REFERENCE TO RELATED APPLICATIONS

This application is based upon and claims the benefit of priority of the prior Japanese Patent Application No. 2008-167619 filed on Jun. 26, 2008, the entire contents of which are incorporated herein by reference.

FIELD

The embodiments discussed herein are related to a semiconductor device including a solid state image pickup device and a portable electronic apparatus.

BACKGROUND

Miniaturization of a metal oxide semiconductor (MOS) type solid state image pickup device is progressing. For example, an average pitch between photodiodes as pixels is not longer than 1.4 μm. As a photodiode is made fine, a read transistor for reading an amount of signal charges converted by the photodiode is also made fine. As an area of a photodiode is reduced, a sensitivity lowers. As read transistors become small in size, their characteristics are varied.

Techniques are desired which efficiently dispose a photodiode, a read transistor and the like in a limited area. For example, a pixel unit structure has been proposed in which three photodiodes are disposed at three apexes of a triangle, and a floating diffusion to which signal charges converted by the photodiodes are transferred, a read transistor and the like are disposed near in a central area of the triangle (refer to JP-A-2006-165567).

SUMMARY

According to aspects of an embodiment, there is provided a semiconductor device including: a plurality of pixel units disposed in a matrix shape, each of said plurality of pixel units including: a first photoelectric conversion element for converting incident light of a first color into signal charges; a second photoelectric conversion element for converting incident light of a second color into signal charges; a third photoelectric conversion element for converting incident light of a third color into signal charges; and a detector circuit shared by the first to third photoelectric conversion elements for detecting the signal charges converted by each of the first to third photoelectric conversion elements, wherein the plurality of pixel units are pixel units adjacently disposing a row juxtaposing the first photoelectric conversion element and detector circuit and a row juxtaposing the second and third photoelectric conversion elements, or pixel units adjacently disposing a column juxtaposing the first photoelectric conversion element and the detector circuit and a column juxtaposing the second and third photoelectric conversion elements.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8A is a schematic cross sectional view of the MOS type solid state image pickup device of the second embodiment illustrated along a row direction.

DESCRIPTION OF EMBODIMENTS

Description will be made first on a metal oxide semiconductor (MOS) type solid state image pickup device of a comparative example. The MOS type solid state image pickup device of the comparative example has a number of pixel units disposed in a matrix shape.

Figure 15A:
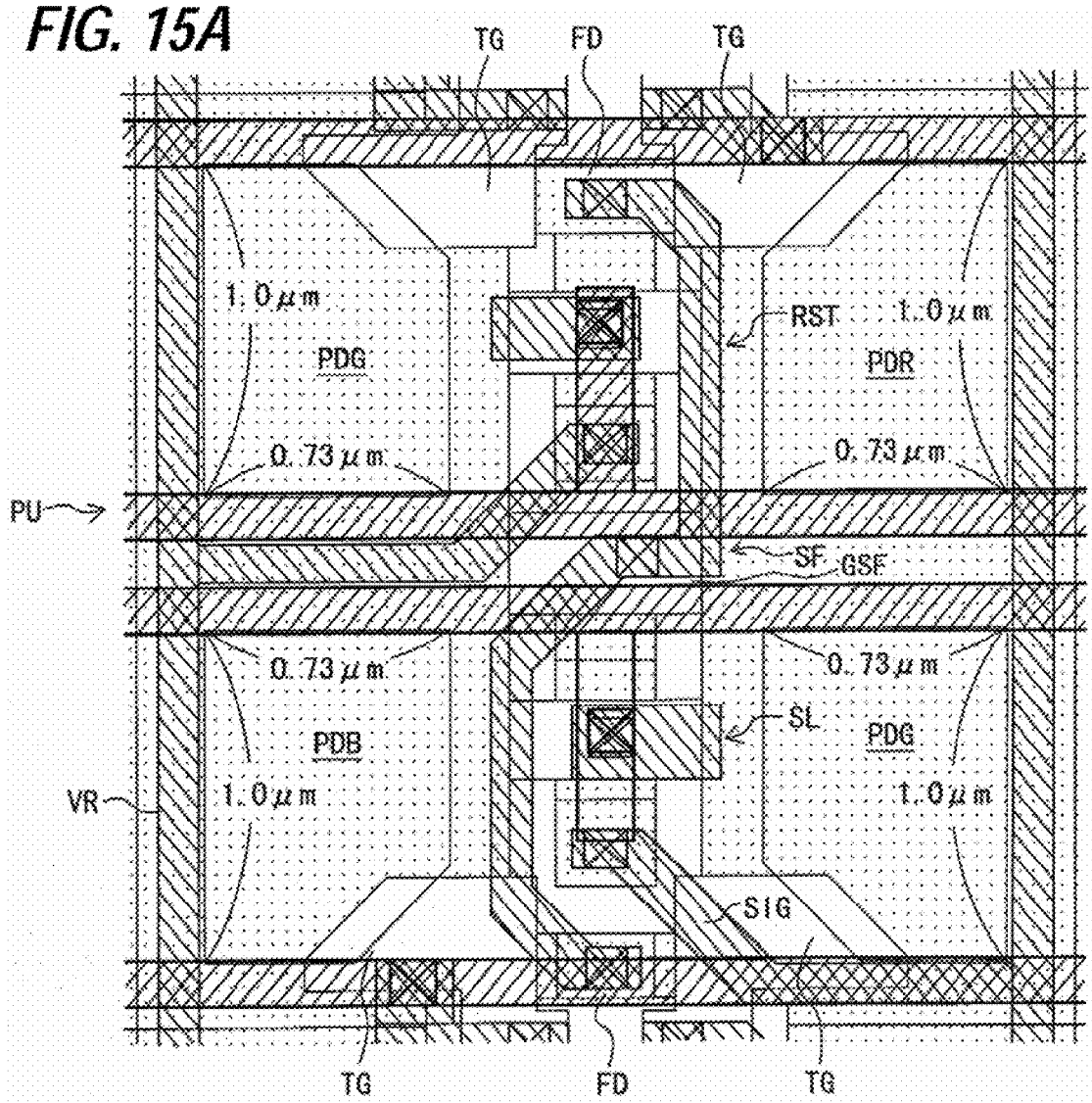
FIGS. 15A and 15B are a schematic plan view and a circuit diagram of a pixel unit of a MOS type solid state image pickup device of a comparative example, respectively.

FIG. 15A is a schematic plan view illustrating one pixel unit PU. The pixel unit PU has a square shape with one side length of 2.8 μm. Four pixel areas, two rows and two columns, are disposed in the pixel unit PU.

In this example, a green pixel photodiode (hereinafter called green photodiode) PDG is disposed in upper left and lower right pixel areas, a red pixel photodiode (hereinafter called red photodiode) PDR is disposed in an upper right pixel area, and a blue pixel photodiode (hereinafter called blue photodiode) PDB is disposed in a lower left pixel area. A Bayer array is arranged in the pixel unit, in which two green pixels are disposed on a diagonal and a red pixel and a blue pixel are disposed on another diagonal crossing the first-mentioned diagonal. An average pitch between adjacent pixels in a row or column direction is, for example, 1.4 μm.

All of the photodiodes PDG, PDR and PDB have a plan shape of a rectangle whose one corner is cut off. An area of each photodiode can be estimated from an area of a rectangle without a cut-off corner. In the following, the term "rectangle" used in the specification is intended to include a square when necessary, and an area of a rectangle is represented in some cases by a multiplication of lengths of adjacent sides. Areas of all photodiodes PDG, PDR and PDB are equal, e.g., 0.73 μm×1.0 μm. An area of a photodiode is preferably broad in order to obtain a high sensitivity.

A transistor area is disposed between a column of pixel areas of the upper left green photodiode PDG and lower left blue photodiode PDB and a column of pixel areas of the upper right red photodiode PDR and lower right green photodiode PDS.

Disposed in the transistor area are a floating diffusion FD, a reset transistor RST, a read transistor SF and a select transistor SL. An area of a rectangular channel disposed under a gate electrode GSF of the read transistor SF is, for example, 0.31 μm×0.30 μm.

Each photodiode is provided with a transfer gate TG for transferring signal charges accumulated in the photodiode to the floating diffusion FD.

Figure 15B:
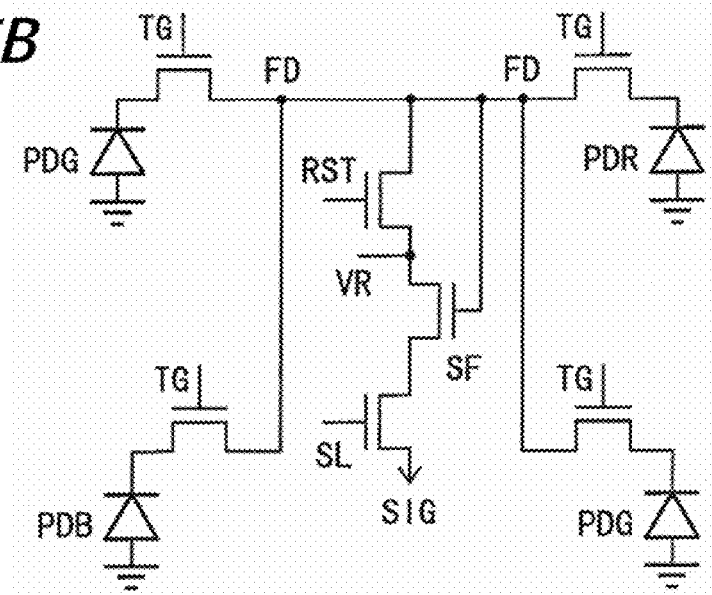

FIG. 15B is a circuit diagram of the pixel unit PU. With reference to FIG. 15B, description will be made on the operation of the pixel unit of the comparative example.

A read operation for the red photodiode PDR will be explained by way of example. As a transfer voltage pulse is applied to the transfer gate TG of the red photodiode PDR, signal charges accumulated in the red photodiode PDR are transferred to the floating diffusion FD.

The floating diffusion FD is electrically connected to the gate electrode GSF of the read transistor SF constituting a source follower transistor. The source of the read transistor SF is connected via the select transistor SL to a signal line SIG from which a signal is output to an external, and the drain of the read transistor SF is connected to a power source voltage VR.

A gate voltage applied to the read transistor SF changes with an amount of charges transferred to the floating diffusion FD, and a current flowing through the transistor SF changes with the gate voltage. In this manner, an amount of charges converted by the read photodiode PDR is detected as a current flowing through the transistor SF.

The floating diffusion FD is connected via the reset transistor RST to the power source voltage VR. While a signal is read to the external, the reset transistor RST is maintained off. After signal reading to the external is completed, the reset transistor RST is turned on to flow charges transferred to the floating diffusion toward the power source voltage VR side to effect resetting.

A similar read operation is performed also for the remaining (two) green photodiodes PDG and blue photodiode PDB. The reset transistor RST, read transistor SF and select transistor SL are shared by four photodiodes in the pixel unit.

In the comparative example, the transfer gates TG of two photodiodes adjacent in a column direction over the pixel units are connected together. Namely, a structure is adopted in which a common transfer gate TG is used for pixel units at different rows. The select transistor SL for selecting a row is therefore used.

The narrower the area of the channel of each read transistor, the larger a variation in performances of read transistors SF is. If there is a variation in read transistors SG of each pixel unit, an output of each pixel unit varies even if amounts of charges read from the photodiodes are equal.

Approaches to having a high sensitivity include ensuring an area of a photodiode and ensuring an area of the channel of the read transistor for suppressing an output variation.

Next, description will be made on a MOS type solid state image pickup device according to the first embodiment of the present invention. Similar to the comparative example, the MOS type solid state image pickup device of the embodiment has also a number of pixel units disposed in a matrix shape. For example, about three million pixel units are disposed.

Figure 1:
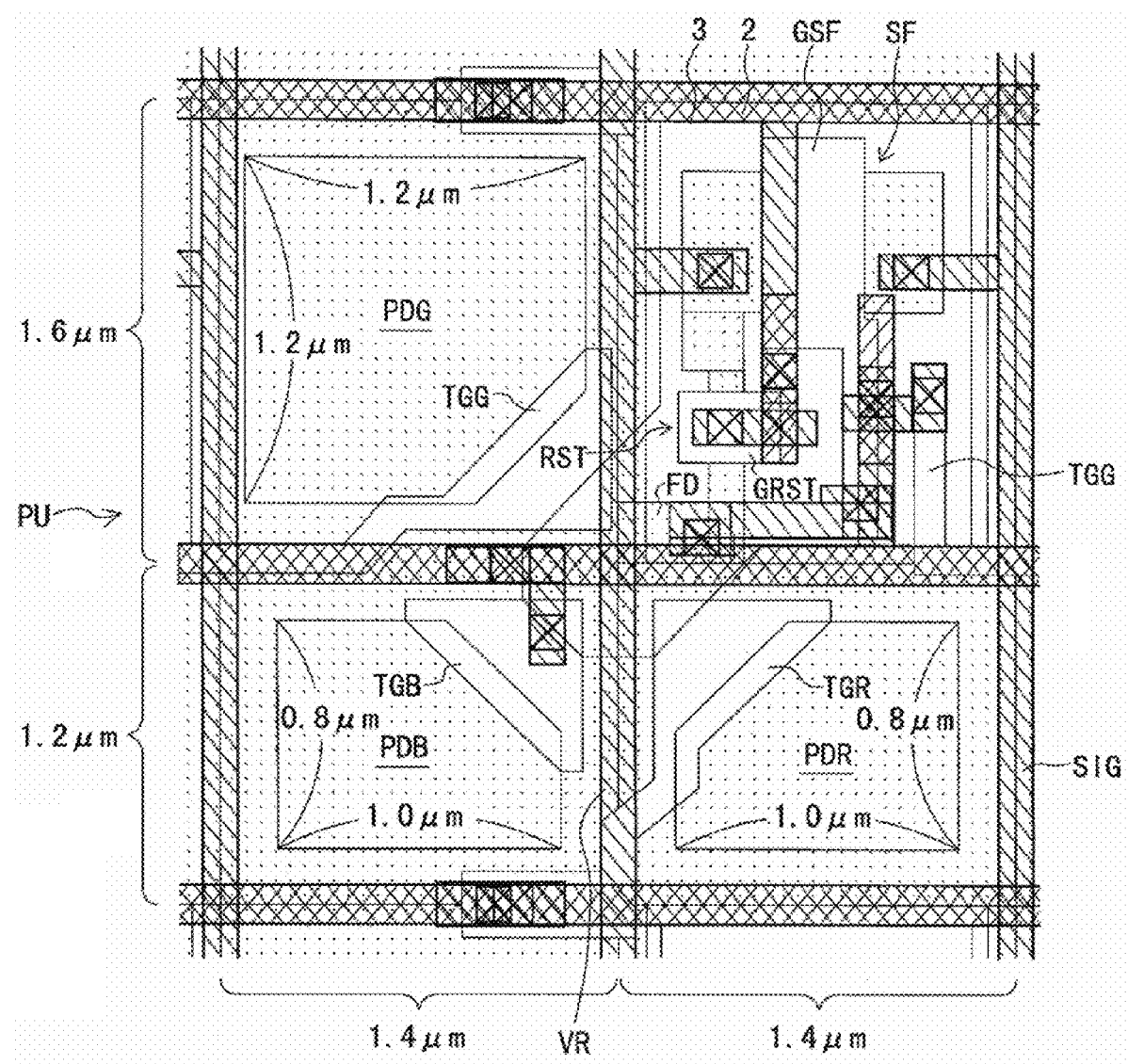
FIG. 1 is a schematic plan view of a pixel unit of a MOS type solid state image pickup device according to a first embodiment.

FIG. 1 is a schematic plan view illustrating one pixel unit PU of the first embodiment. The pixel unit has a square shape with one side length of 2.8 μm. The pixel unit PU is partitioned into four sections, two sections along each of the row and column directions.

In this example, a border is defined in the row direction at a position of 1.4 μm from the left side and 1.4 μm from the right side, and a border is defined in the column direction at a position of 1.6 μm from the upper side and 1.2 μm from the lower side. The upper left and upper right sections have the same area, the lower left and lower right sections have the same area, and the upper left and upper right sections are broader than the lower left and lower right sections.

Three sections among four sections defined in the pixel unit PU are used as pixel areas where photodiodes are disposed. In this example, a green photodiode PDG is disposed in a relatively broad upper left pixel area, and a red photodiode PDR and a blue photodiode PDB are disposed in relatively narrow lower right and lower left pixel areas, respectively. In this arrangement, one green pixel, one red pixel and one blue pixel are disposed in the pixel unit. On remaining section among four sections, i.e., a relatively broad upper right section, is used as a transistor area.

The green photodiode PDG and transistor area are juxtaposed along the row direction, and the blue photodiode PDB and red photodiode PDR are juxtaposed along the row direction adjacent to the green photodiode PDG and transistor area. The green photodiode PDG and blue photodiode PDB are juxtaposed along the column direction, and the transistor area and read photodiode PDR are juxtaposed along the column direction adjacent to the green photodiode PDG and blue photodiode PDB.

All the photodiodes PDG, PDR and PDB have a plan shape of a rectangle with one cut-off corner, and an area of each photodiode can be estimated from an area of a rectangle without a cut-off corner. An area of the green photodiode PDG is, for example, 1.2 μm×1.2 μm, an area of each of the red photodiode PDR and blue photodiode PDB is, for example, 1.0 μm×0.8 μm.

Disposed in the transistor area are a floating diffusion FD, a reset transistor RST, and a read transistor SF. The floating diffusion FD, reset transistor RST and read transistor SF constitute a detector circuit for detecting signal charges converted by each photodiode in the pixel unit PU. The floating diffusion FD, reset transistor RST and read transistor SF are shared by three photodiodes PDG, PDR and PDB. The select transistor is omitted as different from the pixel unit of the comparative example.

An area of the channel of the read transistor SF is, for example, 0.36 μm (length L along a direction coupling source and drain)×0.49 μm (width W). In the layout of the embodiment, a direction of the length L is parallel to the row direction, and a direction of the width W is parallel to the column direction.

In correspondence with the green photodiode PDG, red photodiode PDR and blue photodiode PDB, transfer gate electrodes TGG, TGR and TGB are provided for transferring signal charges converted by the photodiodes to the floating diffusion FD.

Description will be made by comparing the embodiment with the comparative example. It can be said that the pixel unit of the embodiment has a structure that one of pixel areas disposed in two rows and two columns in the comparative example is not used as the area where a photodiode is disposed, but this pixel area is retained as a broad transistor area where the read transistor SF and the like are disposed, without disposing the transistor area between narrow pixel areas.

The pixel unit structure of the embodiment is therefore easy to broaden the area of the channel of the read transistor SF. An area of the channel of the read transistor SF is, for example, 0.31 μm×0.30 μm (=0.093 μm$^2$) in the comparative example, whereas in the first embodiment, the area is, for example, 0.36 μm×0.49 μm (=0.18 μm$^2$), so that an increase by about 90% is possible. It is possible to suppress a variation in performances of read transistors SF.

However, two green photodiodes of the comparative example are reduced to one green photodiode in the embodiment. In this embodiment, therefore, the green photodiode PDG is disposed in a relatively broad section to ensure a broad area of one green photodiode PDG. It is therefore possible to suppress a sensitivity of the green pixel from being lowered and to acquire sufficient luminance information.

An area of the green photodiode PDG is, for example, 0.73 μm×1.0 μm×2 (=1.46 μm$^2$) in the comparative example, whereas in the first embodiment, the area is, for example, 1.2 μm×1.2 μm (=1.44 μm$^2$), so that the areas are maintained generally equal.

An area of each of the red photodiode PDR and blue photodiode PDB is, for example, 0.73 μm×1.0 μm (=0.73 μm$^2$) in the comparative example, whereas in the first embodiment, the area is, for example, 1.0 μm×0.8 μm (=0.8 μm$^2$), so that an increase by about 10% is possible.

It becomes therefore easy to ensure a broad area of the channel of, for example, the read transistor SF, by partitioning the pixel unit into four sections at two rows and two columns, and disposing green, red and blue photodiodes in the three sections and the transistor area in the remaining one section as described above.

Further, it becomes possible to suppress a sensitivity of the green pixel from being lowered and acquire good luminance information, by making the section where the green photodiode in particular is disposed, broader than the sections where the red and blue photodiodes are disposed, to make an area of the green photodiode boarder than the red photodiode area and blue photodiode area.

The green photodiode and transistor area disposed being juxtaposed in the row direction. Therefore, the area of the transistor area is easily broadened at the same time when the area of the green photodiode is broadened (e.g., broadening a width of the green photodiode in the column direction).

Figure 2:
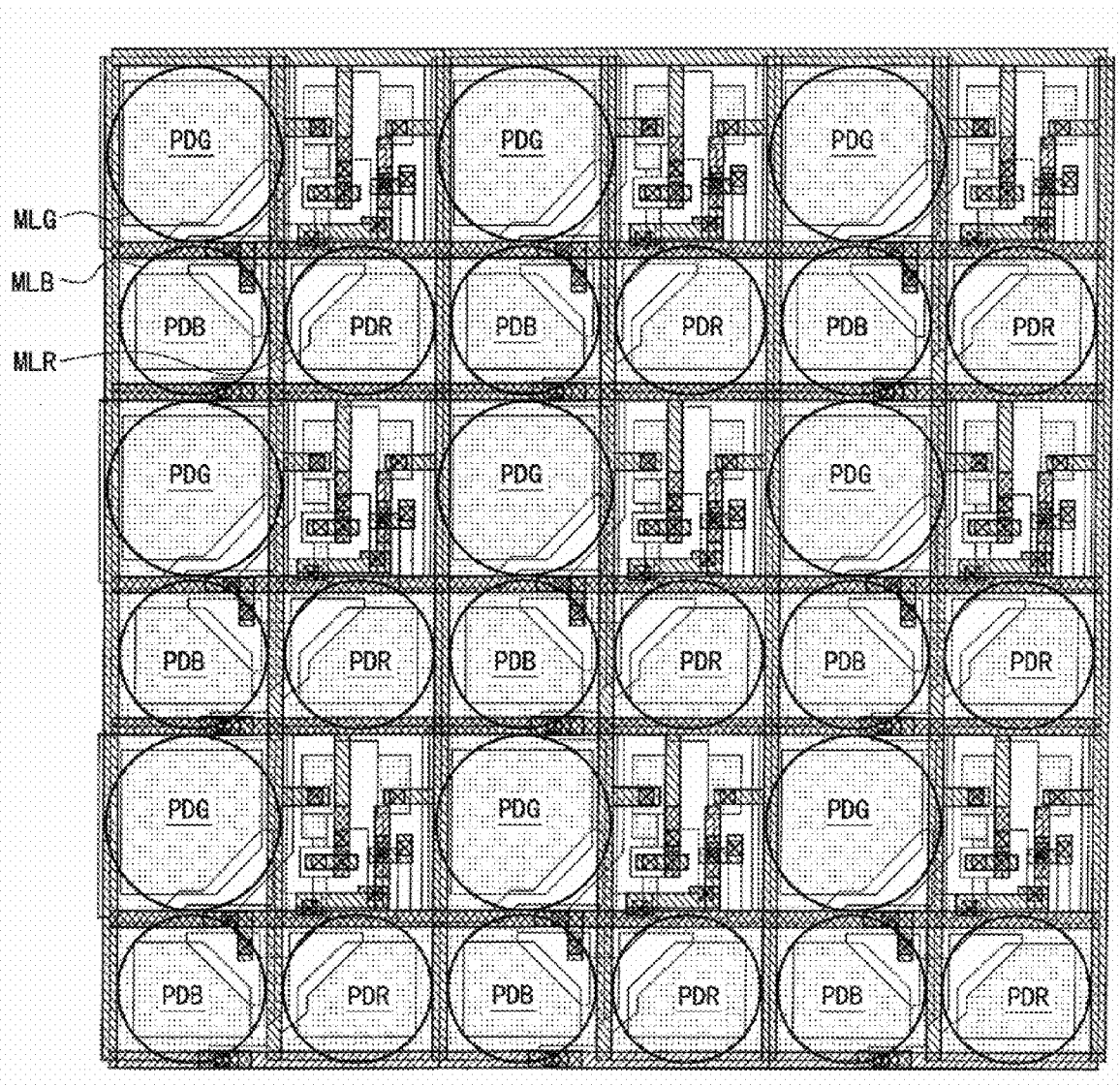
FIG. 2 is a schematic plan view illustrating a portion of pixel units of the first embodiment disposed in a square matrix shape.

FIG. 2 illustrates an example of a layout of a portion disposing the pixel unit of the first embodiment in a square matrix shape in three rows and three columns (an example of a layout of a portion disposing sections in six rows and six columns, representing by the unit section in the pixel unit).

A row alternately juxtaposing a green photodiode PDG and a transistor area and a row alternately juxtaposing a red photodiode PDR and a blue photodiode PDB are alternately juxtaposed along the column direction.

FIG. 2 illustrates also micro lenses MLG, MLR and MLB disposed above respective photodiodes. Each micro lens has a circular shape having a size inclusive of the corresponding photodiode.

Since the green photodiode PDG has a broader area than the area of each of the red photodiode PDR and blue photodiode PDB, the area of the micro lens MLG for the green photodiode is broader than the area of each of the micro lenses MLR and MLB for the red and blue photodiodes.

Between the micro lens and corresponding photodiode, a color filter is intervened having a color corresponding to the photodiode to input light of a desired color to the photodiode.

Figure 3:
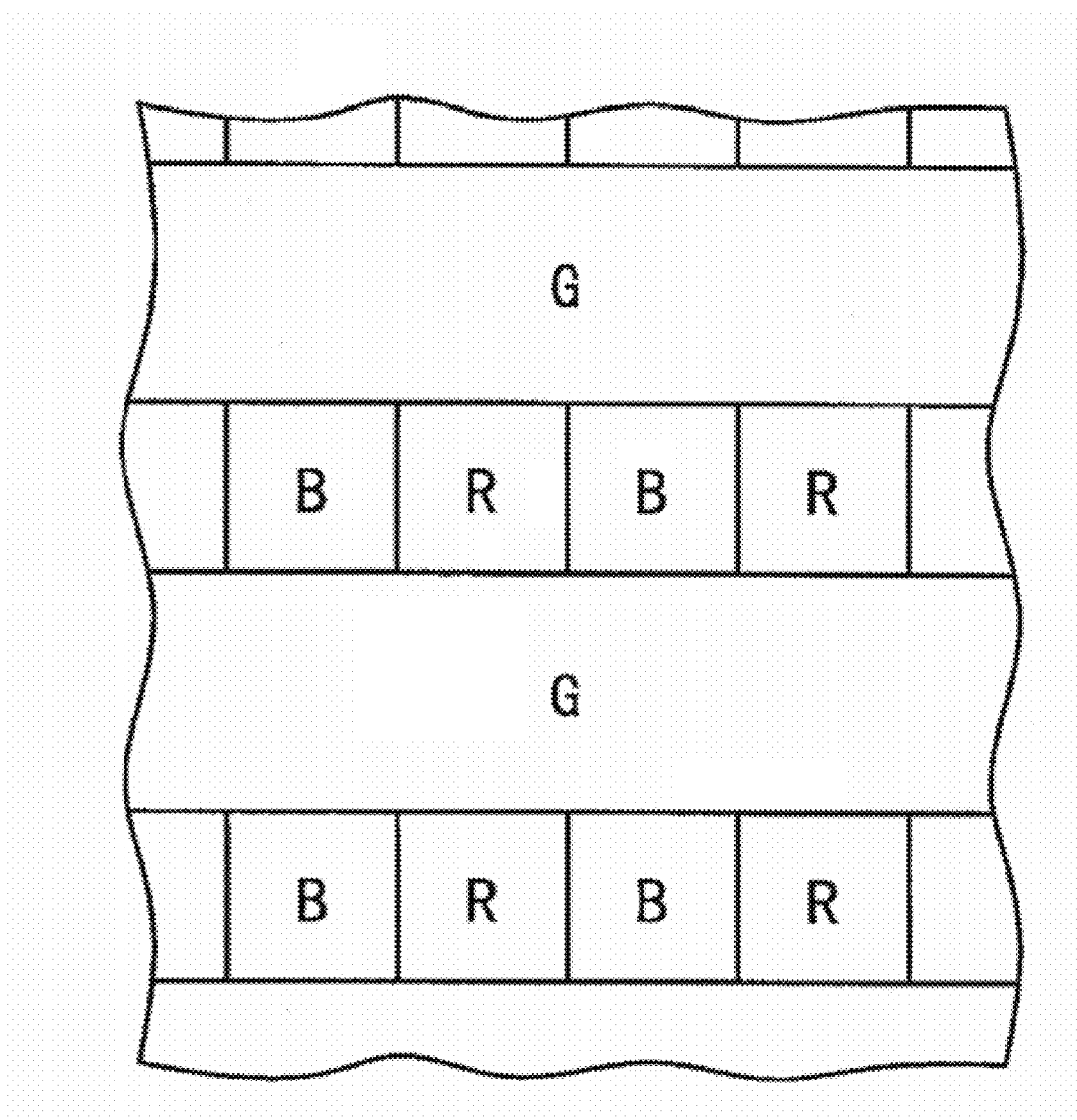
FIG. 3 is a schematic plan view illustrating a layout of color filters of the first embodiment.

FIG. 3 is an example of the layout of color filters of the first embodiment. A row of a single green (G) filter and a row alternately juxtaposing a red (R) filter and a blue (B) filter are alternately juxtaposed in the column direction. In the transistor area, the green filter is disposed.

Next, with reference to FIGS. 4A to 4D, description will be made further on a connection structure of wirings of the pixel unit PU and the like, along with the manufacture sequence of the MOS type solid state image pickup device of the first embodiment. Although description will be made on one pixel unit PU with reference to the drawing, similar description is applied also to other pixel units. Semiconductor device manufacture techniques following, e.g., 90 nm rules, are utilized.

Figure 4A:
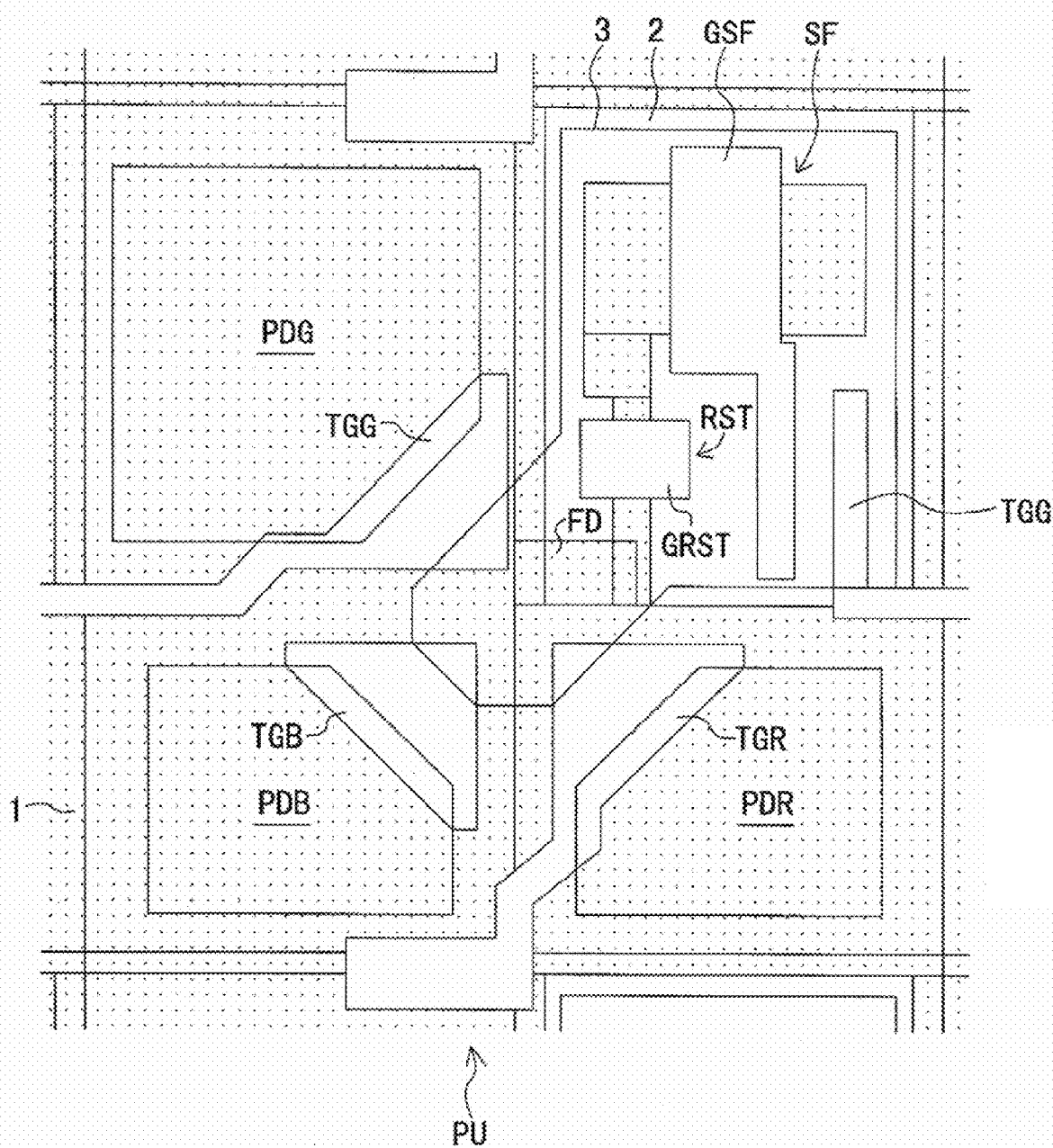
FIG. 4A is a schematic plan view illustrating a manufacture process for the MOS type solid state image pickup device of the first embodiment.

As illustrated in FIG. 4A, active regions 1 are defined in a p-type silicon substrate. Each active region 1 is indicated by adding dots (dots are not displayed in an area under each electrode). In the transistor area defined in an upper right area of the pixel unit PU, an element isolation region 2 of, e.g., a silicon oxide film formed by shallow trench isolation (STI) is formed outside the active region for a floating diffusion FD, a reset transistor RST and a read transistor SF. The element isolation region is represented by white background. The whole areas of the pixel areas defined in the upper left, lower right and lower left of the pixel unit PU are constituted of active regions.

A photodiode is formed by forming an n-type diffusion layer in the p-type silicon substrate 1. The photodiode converts incident light into signal charges. A green photodiode PDG is formed in the upper left pixel area, a red photodiode PDR is formed in the lower right pixel area, and a blue photodiode PDB is formed in the lower left pixel area.

All the photodiodes have a plan shape of a rectangle with one cut-off corner. A corner of each photodiode is cut off, facing a central area of the pixel unit PU (hereinafter simply called a pixel unit central area) surrounded by three photodiodes PDG, PDR and PDB.

A region surrounding the read transistor SF, reset transistor RST and floating diffusion FD in the transistor area and protruding toward the pixel unit central area is an NSD type diffusion region 3 doped with n-type impurities for forming transistor source/drain regions. In this example, the read transistor SF and reset transistor RST are n-type MOS transistors.

The floating diffusion FD is disposed in the transistor area near the pixel unit central area. Transfer gates TGG, TGR and TGB are formed in such a manner that the transfer gates have stacked portions near upon the oblique sides of the cut-off corners of the corresponding photodiodes PDG, PDR and PDB and stacked portions upon the NSD type diffusion region 3.

The active region of the floating diffusion FD is coupled via the active region of the reset transistor RST to the active region of the read transistor SF. In this arrangement, the floating diffusion FD is coupled to the source of the reset transistor, and the drain of the reset transistor RST is coupled to the drain of the read transistor SF.

Gate electrodes GRST and GSF are formed above the channels of the reset transistor RST and read transistor SF, respectively. For example, the transfer gate electrodes TGG, TGR and TGB, and gate electrodes GRST and GSF are formed by patterning a polysilicon layer.

Figure 4B:
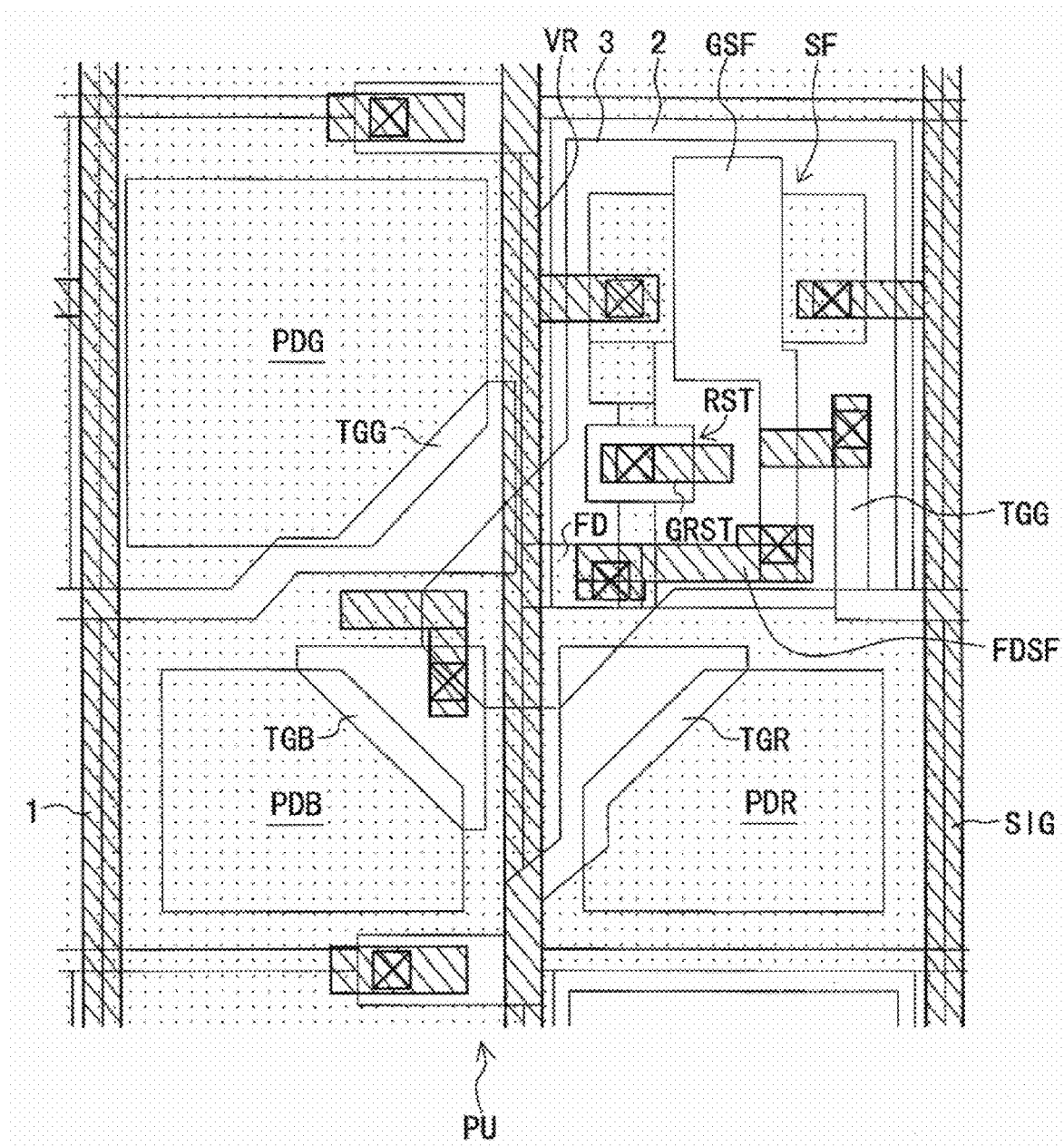
FIG. 4B is a schematic plan view illustrating a manufacture process following FIG. 4A for the MOS type solid state image pickup device of the first embodiment.

Next, as illustrated in FIG. 4B, a first metal layer (signal lines, power source voltage supply line and the like) of Cu or the like and contacts between the first metal layer and underlying regions are formed above the silicon substrate and a polysilicon layer forming the transfer gate electrodes and the like.

A signal line SIG for reading an output signal from the read transistor SF is disposed above the edge of the pixel unit PU along the column direction (vertical direction in the drawing). Further, a power source voltage supply line VR is disposed above a border for partitioning the pixel unit PU in the row direction, i.e., in FIG. 4B above a border for partitioning the pixel unit into the upper left and lower left pixel areas and the upper right transistor area and lower right pixel area. The power source voltage line VR is connected to the drain of the read transistor SF, and the signal line SIG is connected to the source of the read transistor SF.

In the first metal layer, a connection line FDSF between the floating diffusion FD and the gate electrode GSF of the read transistor is formed. Also formed are wiring portions necessary for connection to an upper second metal layer to be formed thereafter.

Figure 4C:
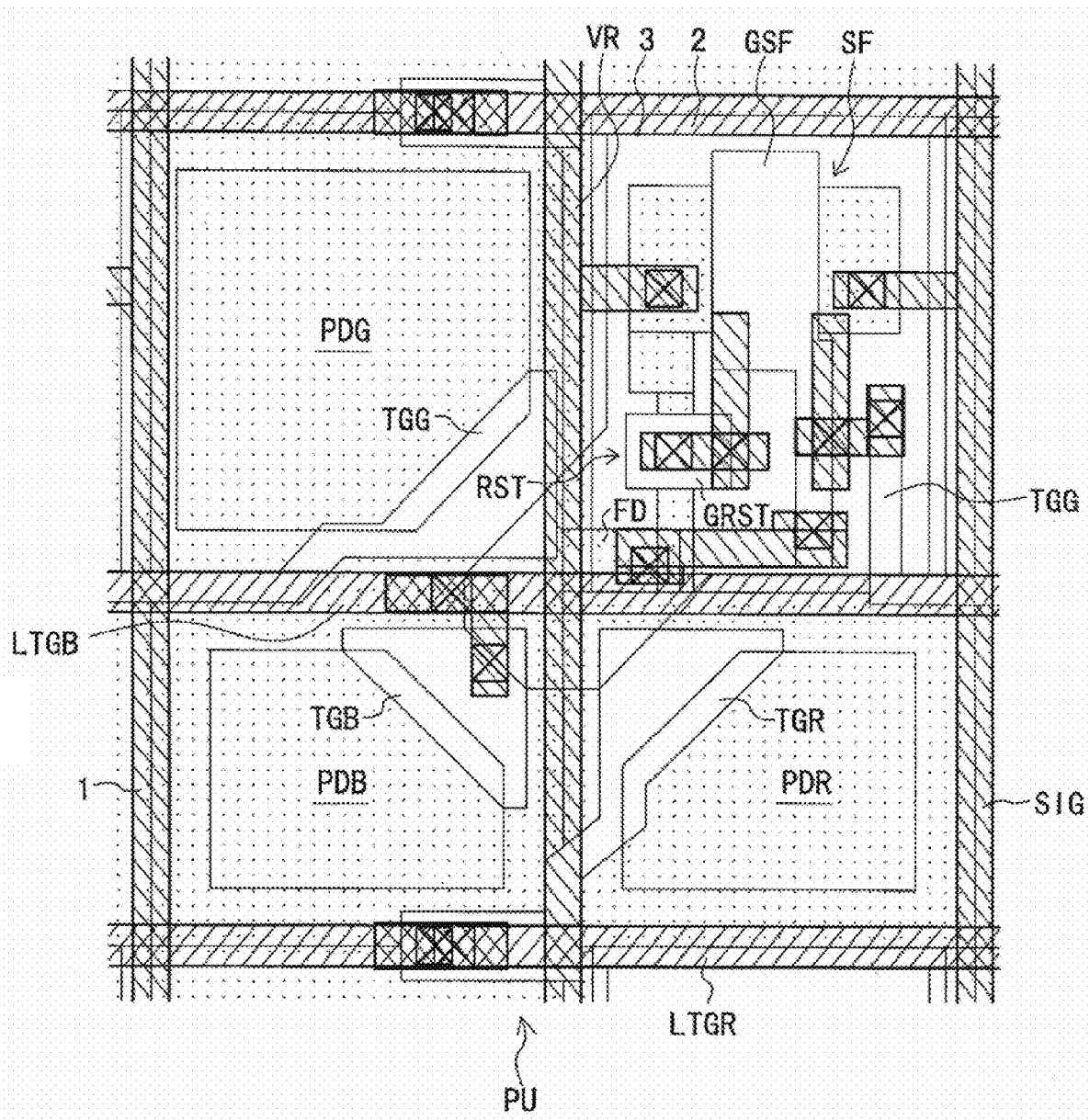
FIG. 4C is a schematic plan view illustrating a manufacture process following FIG. 4B for the MOS type solid state image pickup device of the first embodiment.

As illustrate in FIG. 4C, a second metal layer (TGR line, TGB line and the like) of Cu or the like and contacts between the second metal layer and underlying regions are formed above the silicon substrate, polysilicon layer and first metal layer.

A TGR line (LTGR) for supplying a transfer voltage pulse to the transfer gate electrode TGR is disposed above the edge of the pixel unit PU along the row direction (lateral direction in the drawing). Further, a TGB line (LTGB) for supplying a transfer voltage pulse to the transfer gate electrode TGB is disposed above the border for partitioning the pixel unit PU in the column direction, i.e., in the drawing, above the border for partitioning the pixel unit into the upper left pixel area and upper right transistor area and the lower left and right pixel areas. The TGR line is connected via the wiring portion of the first metal layer to the transfer gate electrode TGR, and the TGB line is connected via the wiring portion of the first metal layer to the transfer gate electrode TGB. Also formed are wiring portions necessary for connection to an upper third medal layer to be formed thereafter.

Figure 4D:
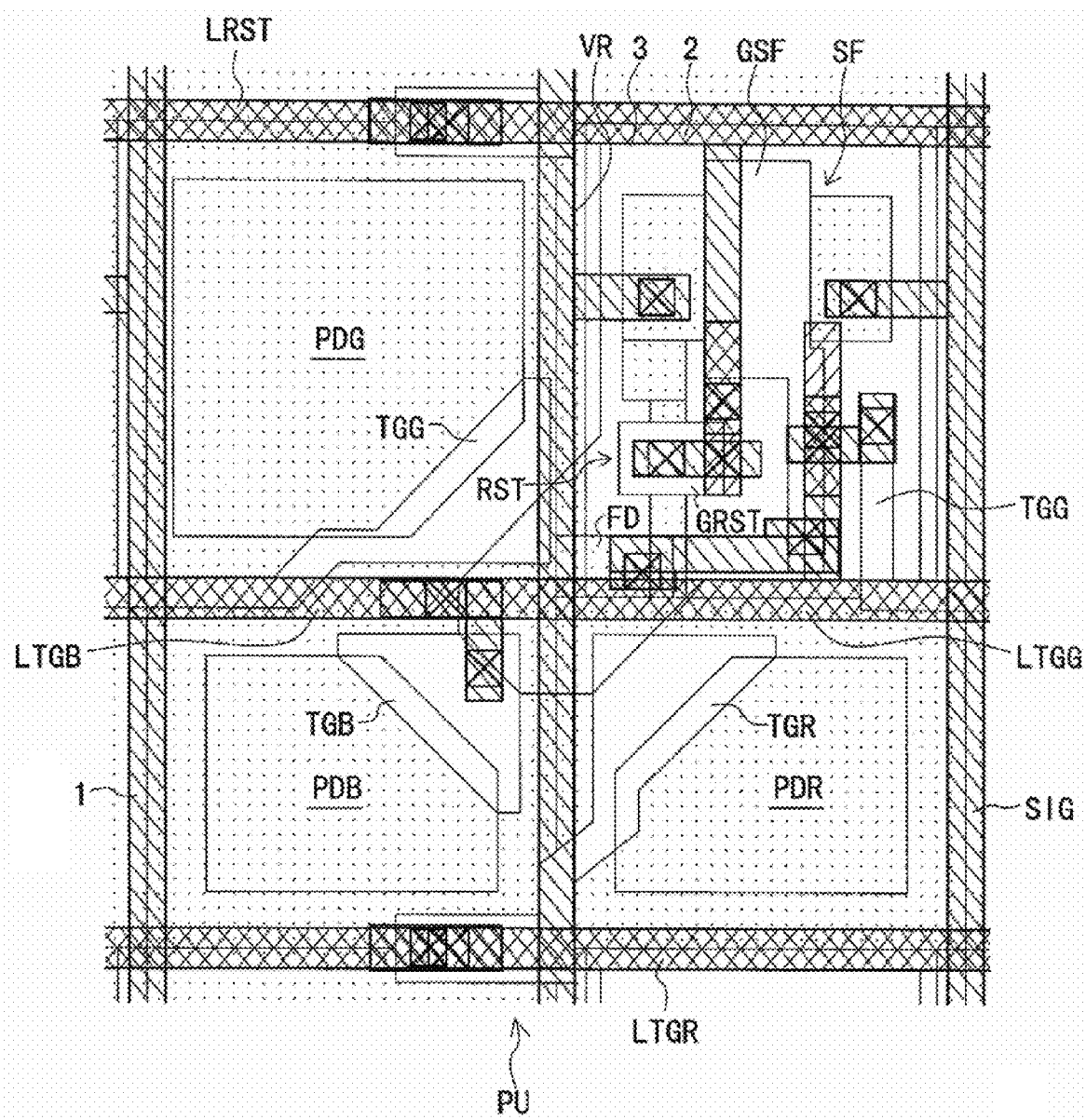
FIG. 4D is a schematic plan view illustrating a manufacture process following FIG. 4C for the MOS type solid state image pickup device of the first embodiment.

Next as illustrated in FIG. 4D, a third metal layer (reset line, TGG line and the like) of Cu or the like and contacts between the third metal layer and underlying regions are formed above the silicon substrate, polysilicon layer and first and second metal layers.

A reset line LRST for supplying a control voltage to the gate electrode GRST of the reset transistor RST is disposed above the edge of the pixel unit PU in the row direction (lateral direction in the drawing), i.e., above the TGR line of the second metal layer. A TGG line (LTGG) for supplying a transfer voltage pulse to the transfer gate electrode TGG is disposed above the edge of the pixel unit PU in the column direction, i.e., above the TGB line of the second metal layer.

The reset line LRST is connected via the wiring portions of the first and second metal layers to the gate electrode GRST of the reset transistor, and the TGG line is connected via the wiring portions of the first and second metal layers to the transfer gate TGG.

Color filters, micro lenses and the like are further formed to manufacture the MOS type solid state image pickup device of the first embodiment. In manufacturing the MOS type solid state image pickup device of the embodiment, well-known techniques for manufacturing a MOS type solid state image pickup device may be used where appropriate.

Figure 5A:
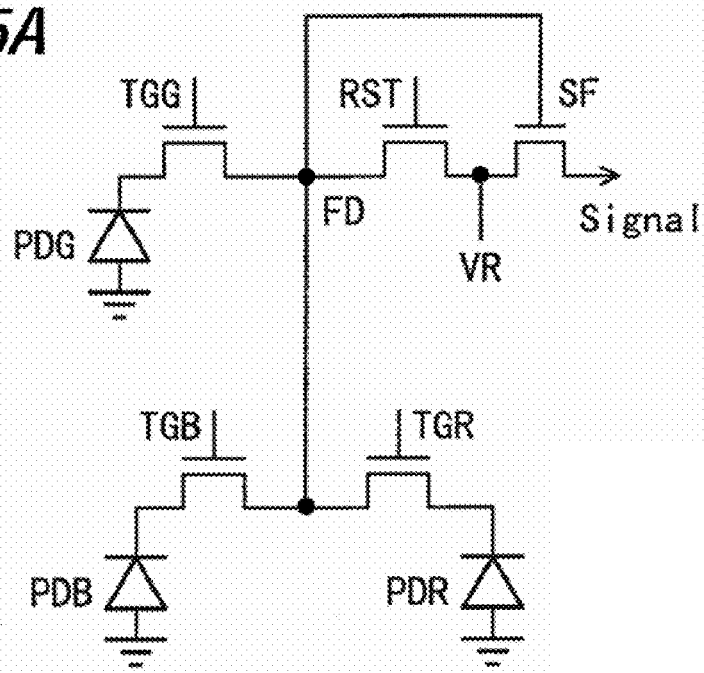
FIGS. 5A and 5B are a circuit diagram of the pixel unit of the first embodiment and a timing chart of a signal read operation.

Next, with reference to FIGS. 5A and 5B, description will be made on a signal read sequence for the MOS type solid state image pickup device of the first embodiment. FIG. 5A is a circuit diagram of the pixel unit of the embodiment.

In the MOS type solid state image pickup device of the embodiment, a signal line is provided to obtain an output signal from each pixel unit, signals of pixel units of one row can be read at the same time. FIG. 5B is a timing chart illustrating a read operation of selecting a signal read row and reading one (e.g., red) photodiode in the pixel unit at the select row.

Figure 5B:
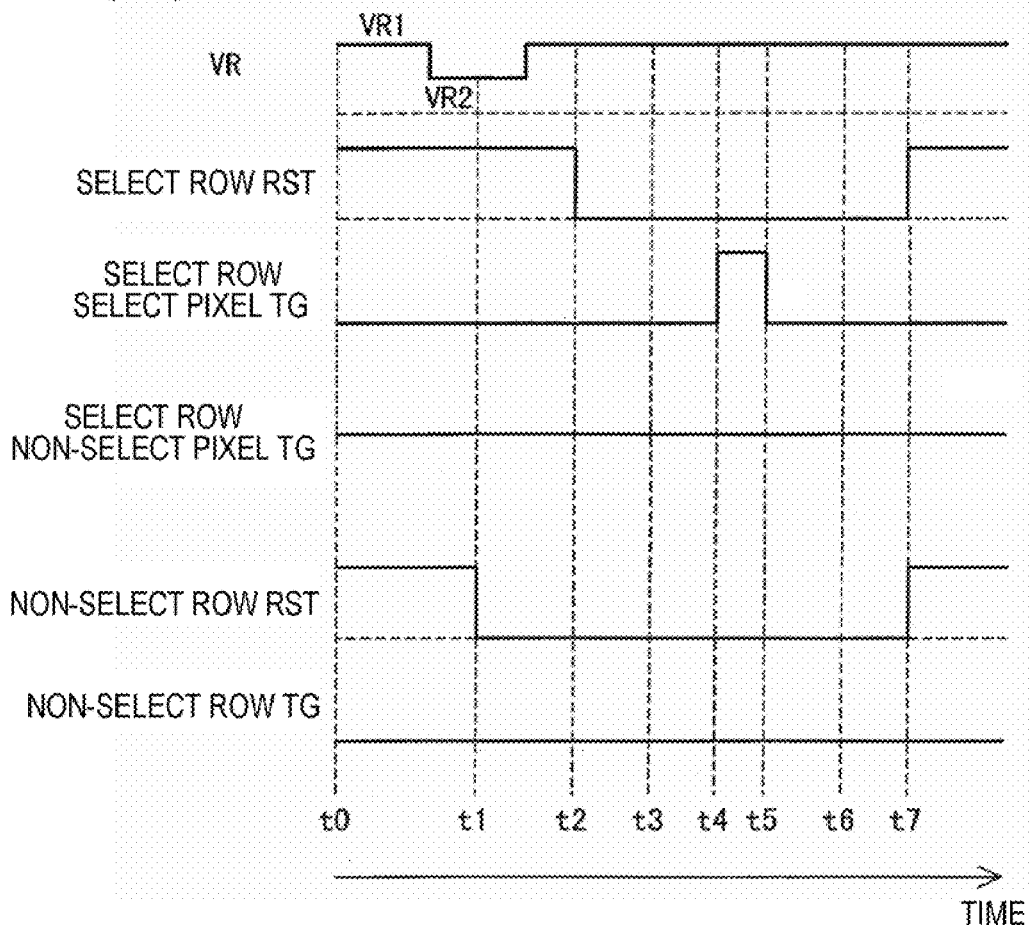

FIG. 5B illustrates a change with time in a power source voltage VR, a gate voltage of a reset transistor RST with a select row (select row RST), a voltage applied to the transfer gate electrode of a signal reading color photodiode in the pixel unit with a select row (select row select pixel TG), a voltage applied to the transfer gate electrode of a signal non-reading color photodiode in the pixel unit with a select row (select row non-select pixel TG), a gate voltage of the reset transistor with a non-select row (non-select row RST), and a voltage applied to the transfer gate electrodes of (all) photodiodes with a non-select row (non-select row TG).

The power source voltage VR takes a positive high voltage VR1 (e.g., 2.8 V) and a positive low voltage VR2 (e.g., 1.8 V). At an initial time t0, the power source voltage is the high VR1, the select row RST is on, and the non-select row RST is also on.

The power source voltage lowers from VR1 to VR2. At a time t1 during the period while the power source voltage lowers to VR2, the non-select row RST is made off. In this manner, in the pixel unit having the non-select row, the floating diffusion FD is in a state that the low voltage VR2 is written therein.

In the state that the low voltage VR2 is written in the floating diffusion FD of the pixel unit with a non-select row, the low voltage VR2 is selected so that the read transistor SF will not become on. A signal will not therefore be output from the pixel unit with a non-select row.

Thereafter, the power source voltage rises from VR2 to VR1. At a time t2 during the period while the power source voltage takes the high VR1, the select row RST is made off. Therefore, the pixel unit with the select row enters the state that a high voltage VR1 is written in the floating diffusion FD.

In the state that the high voltage VR1 is written in the floating diffusion FD of the pixel unit with the select row, the high voltage VR1 is selected so that the read transistor SF becomes on. A signal can thus be output from the pixel unit with a select row.

Next, at a time t3 an output from the pixel unit with a select row is detected as noise components. Next, during a period from a time t4 to a time t5, a select row select pixel TG is made on (e.g., by applying a transfer voltage pulse of 2.8 V), and signal charges are transferred from the read color photodiode to the floating diffusion FD.

Next at a time t6, in the state that the signal charges are transferred to the floating diffusion FD, an output from the pixel unit with a select row is detected again, and a difference between this output and the previously detected noise components is obtained as an output signal for the subject color.

Next, at a time t7, the select row RST is made on to reset the charges transferred to the floating diffusion FD. At the time t7, the non-select row RST is also made on.

A voltage applied to the transfer gate electrode of the photodiode of the color from which a signal is not read, in the pixel unit with a select row (select row non-select pixel TG) and a voltage applied to the transfer gate of the photodiode in the pixel unit with a non-select row (non-select row TG) are always off.

By executing this read operation for the photodiode of each color in each row, image signals are read from the MOS type solid state image pickup device of the embodiment. It is not necessary to use a select transistor for row select.

In the MOS type solid state image pickup device of the comparative example, four photodiodes are disposed in each pixel unit, and corresponding four transfer gates are required. In the MOS type solid state image pickup device of the embodiment, only three photodiodes are disposed in each pixel unit, and correspondingly three transfer gates are used. The degree of layout freedom for transfer gate electrodes is therefore increased.

In the MOS type solid state image pickup device of the comparative example, since a common transfer gate electrode is used for adjacent pixel units in the column direction, the select transistor SL is necessary. However, in the MOS type solid state image pickup device of the embodiment, transfer gate electrodes are independent for adjacent pixel units in the column direction so that the select transistor SL can be omitted. By omitting the select transistor SL, it is easy to ensure a broad layout area of read transistors and the like.

Next, a MOS type solid state image pickup device of the second embodiment will be described.

A different point from the first embodiment resides in that the size of each section in a pixel unit is changed in the column direction to change the size of each color photodiode. The layout of color photodiodes, a wiring connection structure and the like are similar to the first embodiment.

Figure 6:
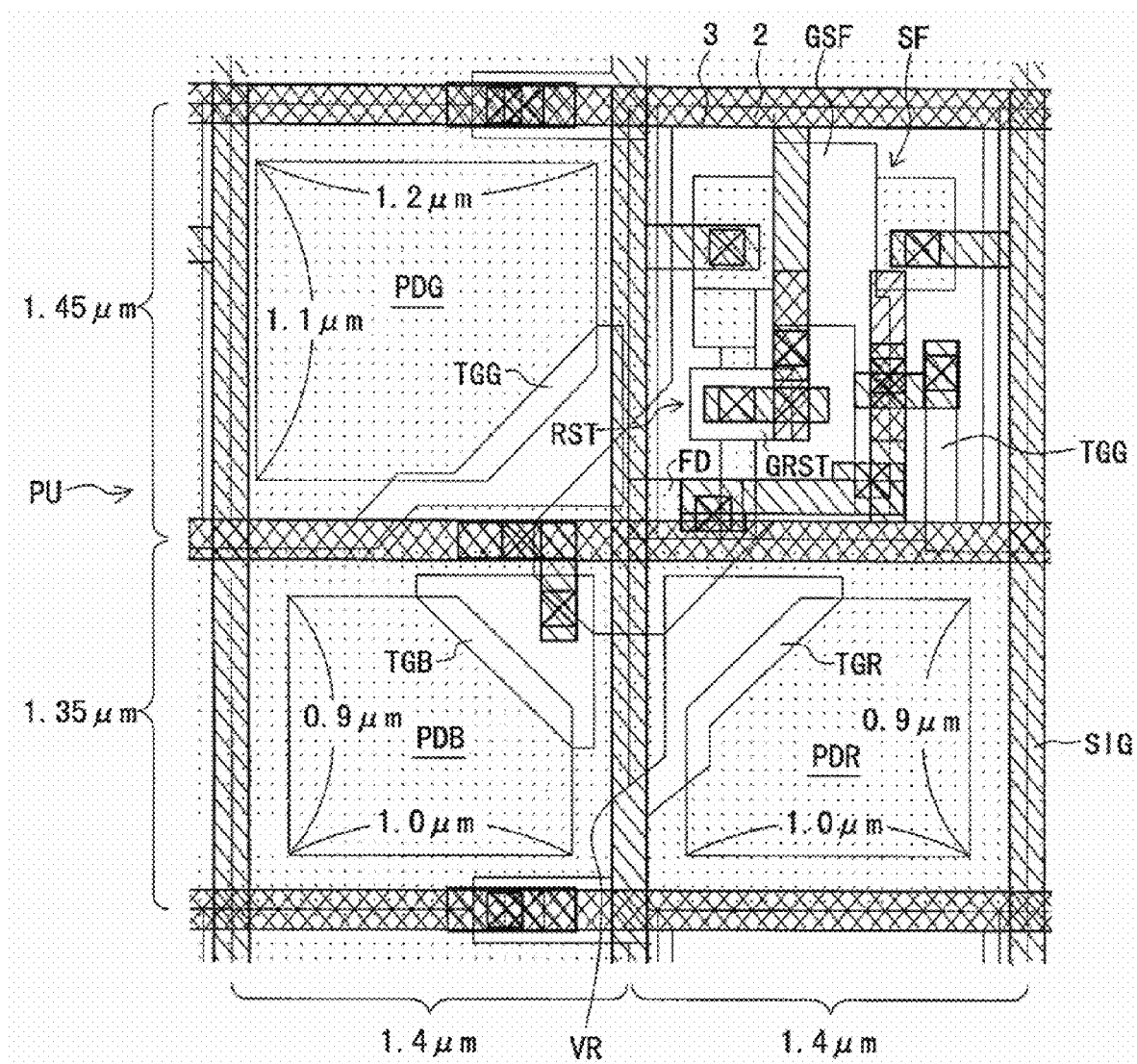
FIG. 6 is a schematic plan view of a pixel unit of a MOS type solid state image pickup device of a second embodiment.

FIG. 6 is a schematic plan view illustrating one pixel unit PU of the second embodiment. For example, similar to the first embodiment, the pixel unit PU has a square shape having a side length of 2.8 µm. A border is defined in the row direction at a position of 1.4 µm from the left side and 1.4 µm from the right side, and a border is defined in the column direction at a position of 1.45 µm from the upper side and 1.35 µm from the lower side.

As compared with the first embodiment, an area of the upper sections is narrow, i.e., an area for a pixel area of a green photodiode PDG and a transistor area is narrow, and an area of the lower sections is broad, i.e., an area for a pixel area of a red photodiode PDR and a pixel area of a blue photodiode PDB is broad.

An area of the green photodiode PDG is, for example, 1.2 µm×1.1 µm, and an area of each of the red photodiode PDR and blue photodiode PDB is, for example, 1.0 µm×0.9 µm. An area of the channel of a read transistor SF is, for example, 0.36 µm (length L in a source/drain direction)×0.39 µm (width W).

An area of the green photodiode PDG is, for example, 0.73 µm×1.0 µm×2 (=1.46 µm$^2$) in the comparative example, whereas in the second embodiment, the area is, for example, 1.2 µm×1.1 µm (=1.32 µm$^2$), so that the area is reduced by about 10%.

An area of each of the red photodiode PDR and blue photodiode PDB is, for example, 0.73 µm×1.0 µm (=0.73 µm$^2$) in the comparative example, whereas in the second embodiment, the area is, for example, 1.0 µm×0.9 µm (=0.9 µm$^2$), so that an increase by about 20% is possible.

An area of the channel of the read transistor SF is, for example, 0.31 µm×0.30 µm (=0.093 µm$^2$) in the comparative example, whereas in the second embodiment, the area is, for example, 0.36 µm×0.39 µm (=0.14 µm$^2$), so that an increase by about 50% is possible.

As compared with the first embodiment, an area of the green photodiode is reduced in the second embodiment. In order to compensate for a reduction in a sensitivity caused by a reduce area, a micro lens for guiding light to the green photodiode is made larger in the second embodiment as will be described in the following.

Figure 7:
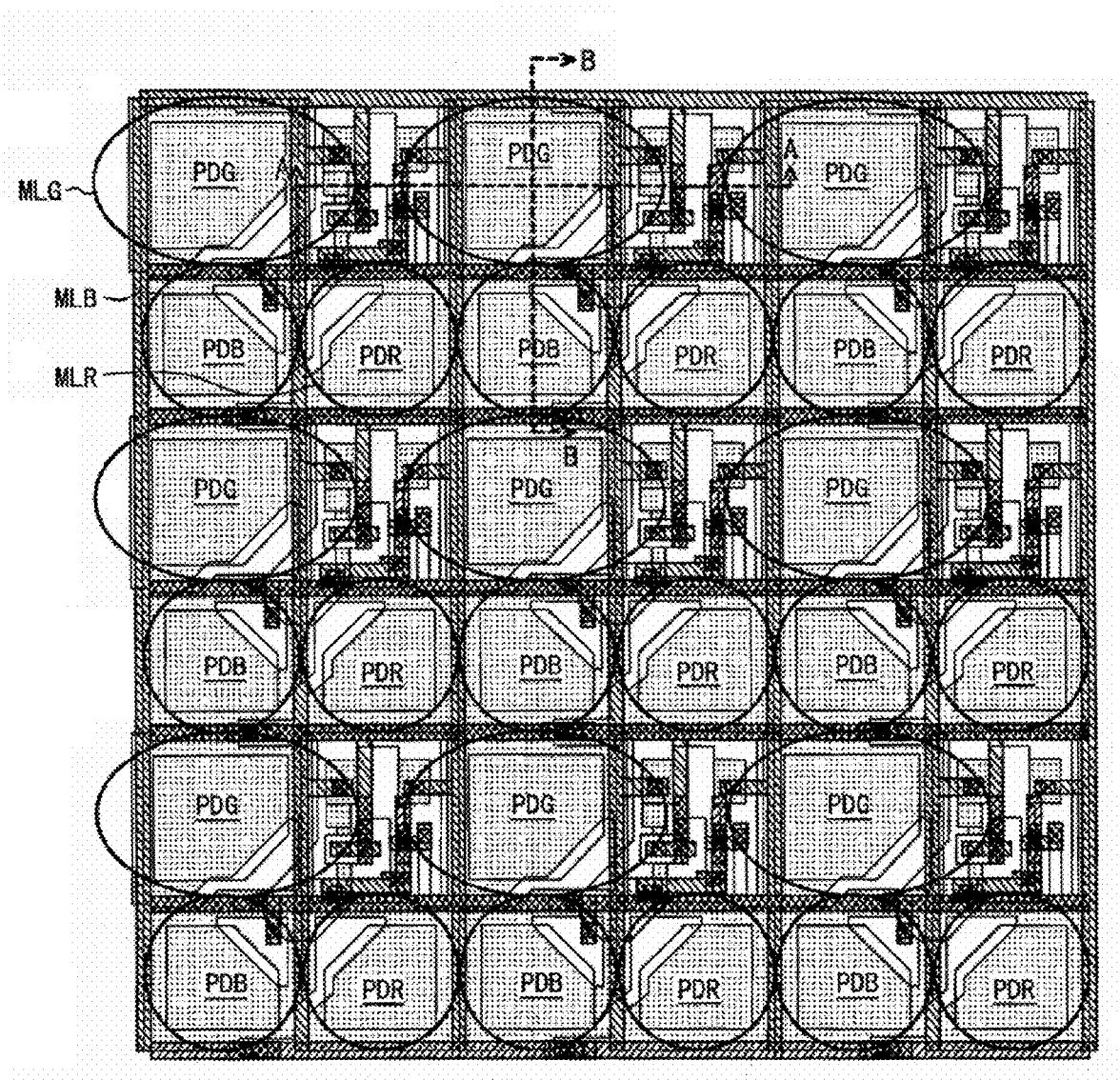
FIG. 7 is a schematic plan view illustrating a portion of pixel units of the second embodiment disposed in a square matrix shape.

FIG. 7 illustrates an example of a layout of a portion disposing the pixel unit of the second embodiment in a square matrix shape in three rows and three columns (an example of a layout of a portion disposing sections in six rows and six columns, representing by the unit section in the pixel unit). Similar to the first embodiment, circular micro lenses MLR and MLB having a size inclusive of a corresponding photodiode are disposed above a red photodiode PDR and a blue photodiode PDB, respectively.

On the other hand, an ellipsoidal micro lens MLG elongated in the row direction and having a size inclusive of the green photodiode is disposed above the green photodiode PDG. The green micro lens MLG is formed large extending to the transistor areas adjacent to the green photodiode. For example, the green micro lens has a portion superposed upon the active region of the read transistor SF as viewed in plan.

As a large micro lens extending to the transistor areas is used for the green photodiode, an optical converging area becomes broad so that it is possible to suppress a lowered sensitivity to be caused by a reduced area of the green photodiode.

In this embodiment, pixel units having the same layout of color photodiodes and the transistor area are disposed in a square matrix shape. Since the pattern is regular, for example, wiring design becomes easy.

The green photodiode PDG and transistor area are alternately juxtaposed along the row direction. Since the transistor areas are maintained on both side of each green photodiode, a large micro lens can be formed extending from the green photodiode to the transistor areas on both sides of the green photodiode.

Figure 16:
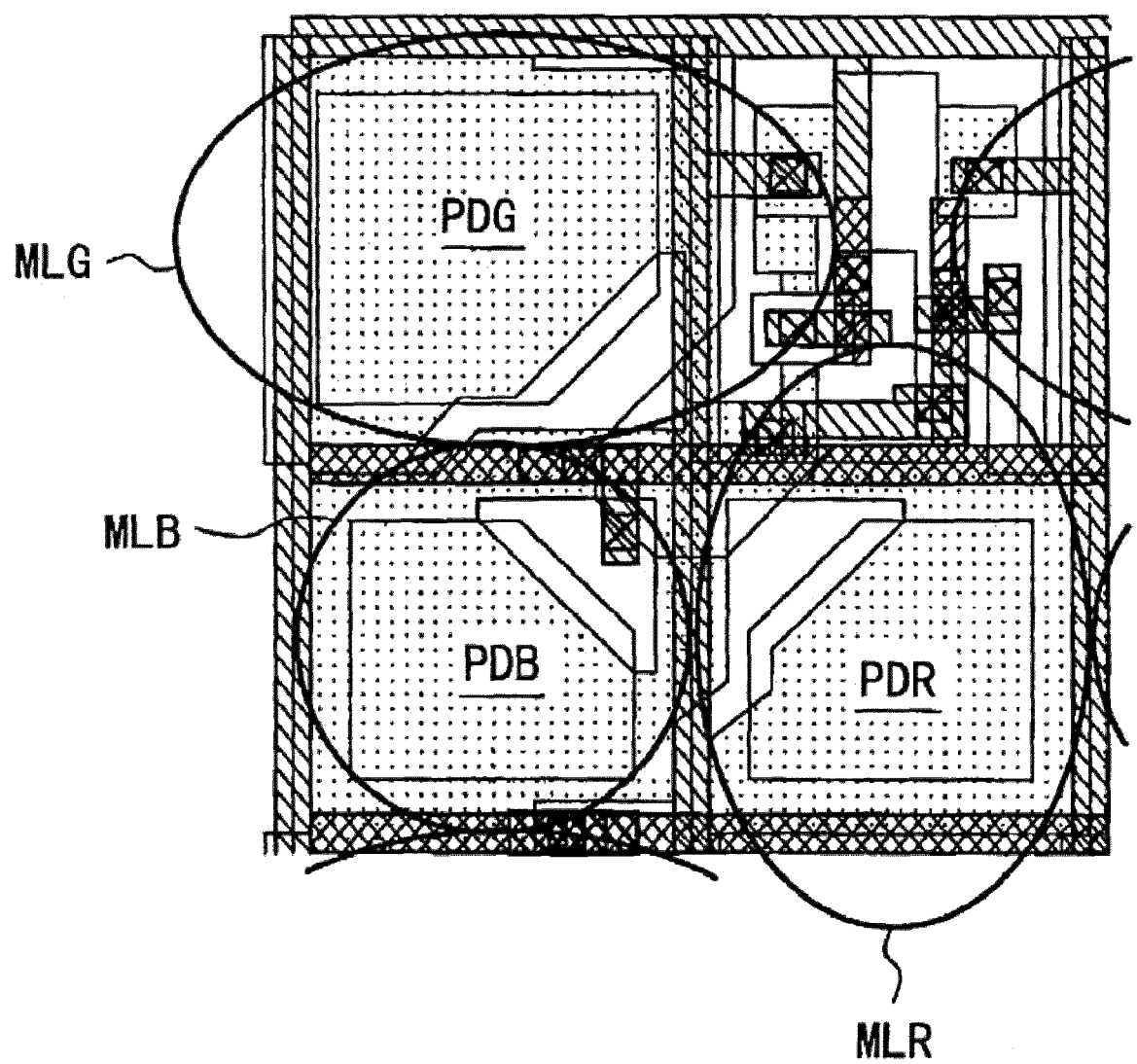
FIG. 16 is a schematic plan view illustrating another layout of micro lens of the second embodiment.

On the other hand, along the column direction the red photodiode PDR and transistor area are alternately juxtaposed. It is therefore possible to make the red micro lens larger than the blue micro lens and in an ellipsoidal shape elongated along the column direction and extending to a space of the transistor area not disposed with the green micro lens (FIG. 16). This arrangement is expected to be effective in the case wherein a red sensitivity is made higher than a blue sensitivity. If a blue sensitivity is desired to be set higher than a red sensitivity, the positions of red and blue color filters are exchanged.

FIG. 8A illustrates a row direction cross section (horizontal cross section) taken along a broken line arrow AA in the schematic plan view in FIG. 7. FIG. 8A is a schematic cross sectional view illustrating a green photodiode PDG and transistor areas on both sides of the green photodiode.

The photodiode PDG is formed by forming an n-type diffusion layer 52G in a p-type silicon substrate 51. The photodiode PDG and a transistor in the transistor area are isolated, for example, by an element isolation region 53 formed by STI. An n-type region NSD is formed in the transistor area. A gate electrode GSF of a read transistor SF is formed above the silicon substrate 51. The gate electrode GSF may be made of polysilicon.

Interlayer insulating films 60, 62, 64, 66, 68 and 70 are laminated above the silicon substrate 51. For example, Cu barrier films 61, 63, 65, 67 and 69 are formed between adjacent interlayer insulating films. For example, the interlayer insulating film is made of silicon oxide, and the Cu barrier film is made of SiC or SiN.

A first metal layer M1L, a second metal layer M2L and a third metal layer M3L are formed in the interlayer insulating films 62, 64 and 66. The first to third metal layers M1L to M3L are made of, e.g., Cu. A fourth metal layer made of Al or the like is formed in an upper interlayer insulating film. The fourth metal layer is used in a black pixel and peripheral circuit area other than the color pixel area.

A cover film 71 of SiN or the like is formed on the interlayer insulating film 70. A green color filter 72G is formed covering the cover film 71. A micro lens MLG for the green photodiode PDG is formed on the green color filter 72G. The micro lens MLG is formed large extending to the transistor areas.

Light 80 converged by the micro lens MLG becomes incident upon the photodiode PDG. The first to third metal layers M1L to M3L are not disposed on the optical path of incidence light upon the photodiode. In order not to form an unnecessary refractive index distribution, the Cu barrier films 61, 63, 65, 67 and 69 are removed on the optical path of incidence light upon the photodiode.

Figure 8B:
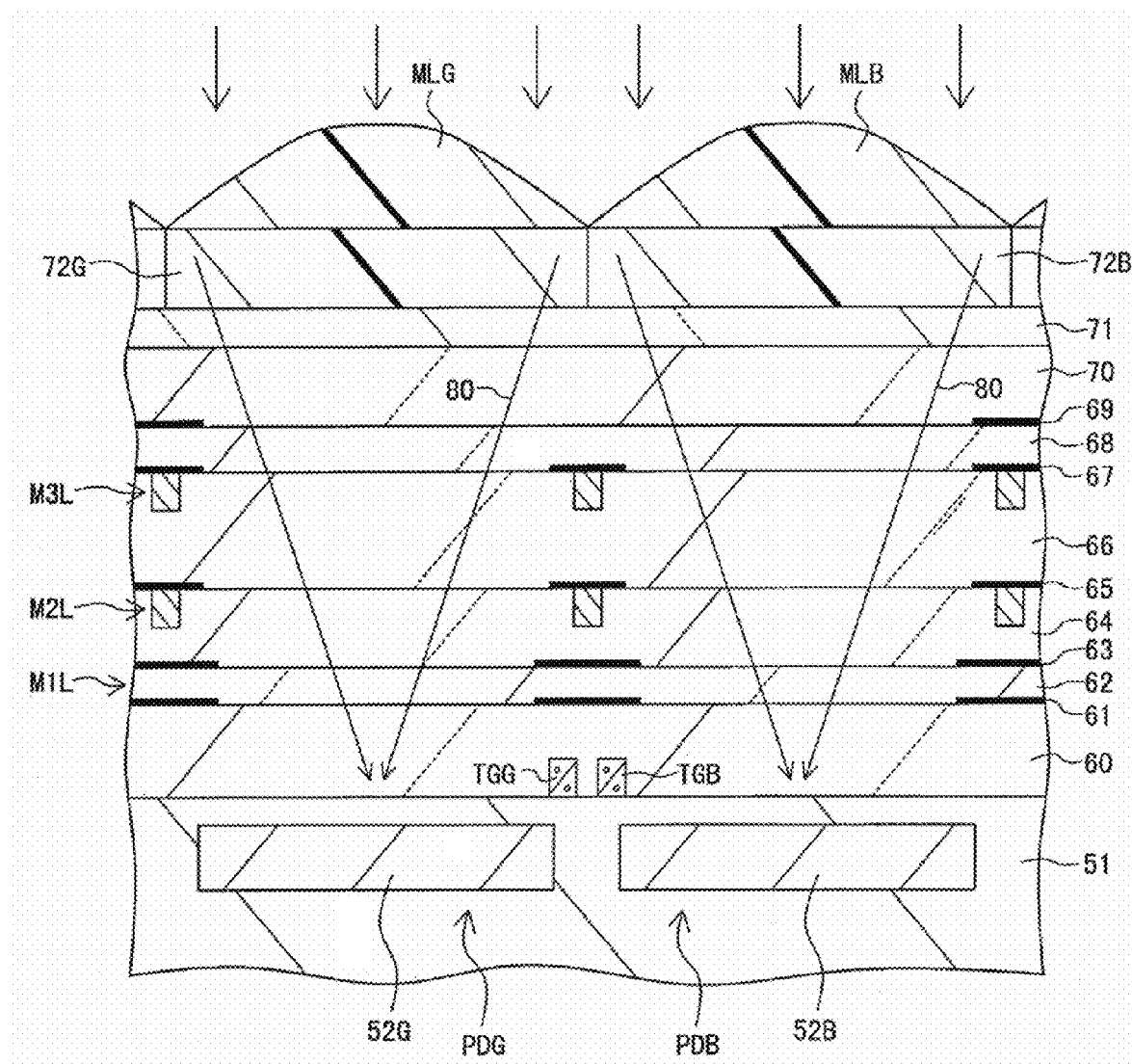
FIG. 8B is a schematic cross sectional view of the MOS type solid state image pickup device of the second embodiment illustrated along a column direction.

FIG. 8B is a column direction cross section (vertical cross section) taken along a broken line arrow BB in the schematic plan view in FIG. 7. FIG. 8B is a schematic cross sectional view illustrating a green photodiode PDG and a blue photodiode adjacent along the column direction.

Photodiodes PDG and PDB are formed by n-type diffusion layers 52G and 52B formed in the p-type silicon substrate 51. In FIG. 8B, transfer gate electrodes TGC and TGB of the photodiodes PDG and PDB are illustrated as a polysilicon electrode layer above the silicon substrate 51. The structure above the polysilicon electrode layer is similar to that described with FIG. 8A.

In the column direction cross section illustrated in FIG. 8B, a green color filter 72G is formed on the cover film 71 above the green photodiode PDG, and a blue color filter 72B is formed above the blue photodiode PDB. A micro lens MLG for the green photodiode PDG is formed on the green color filter, and a micro lens MLB for the blue photodiode PDB is formed on the blue color filter 72B.

Next, a MOS type solid state image pickup device of the third embodiment will be described. In the first and second embodiments, the pixel area disposing the green photodiode and the transistor area are juxtaposed along the row direction. In the third embodiment, the row direction and column direction are exchanged, and the green photodiode and the transistor area are juxtaposed along the column direction. The layout of each color photodiode and transistors in the pixel unit corresponds to the layout of the first embodiment rotated by 90° in the clockwise direction.

Figure 9:
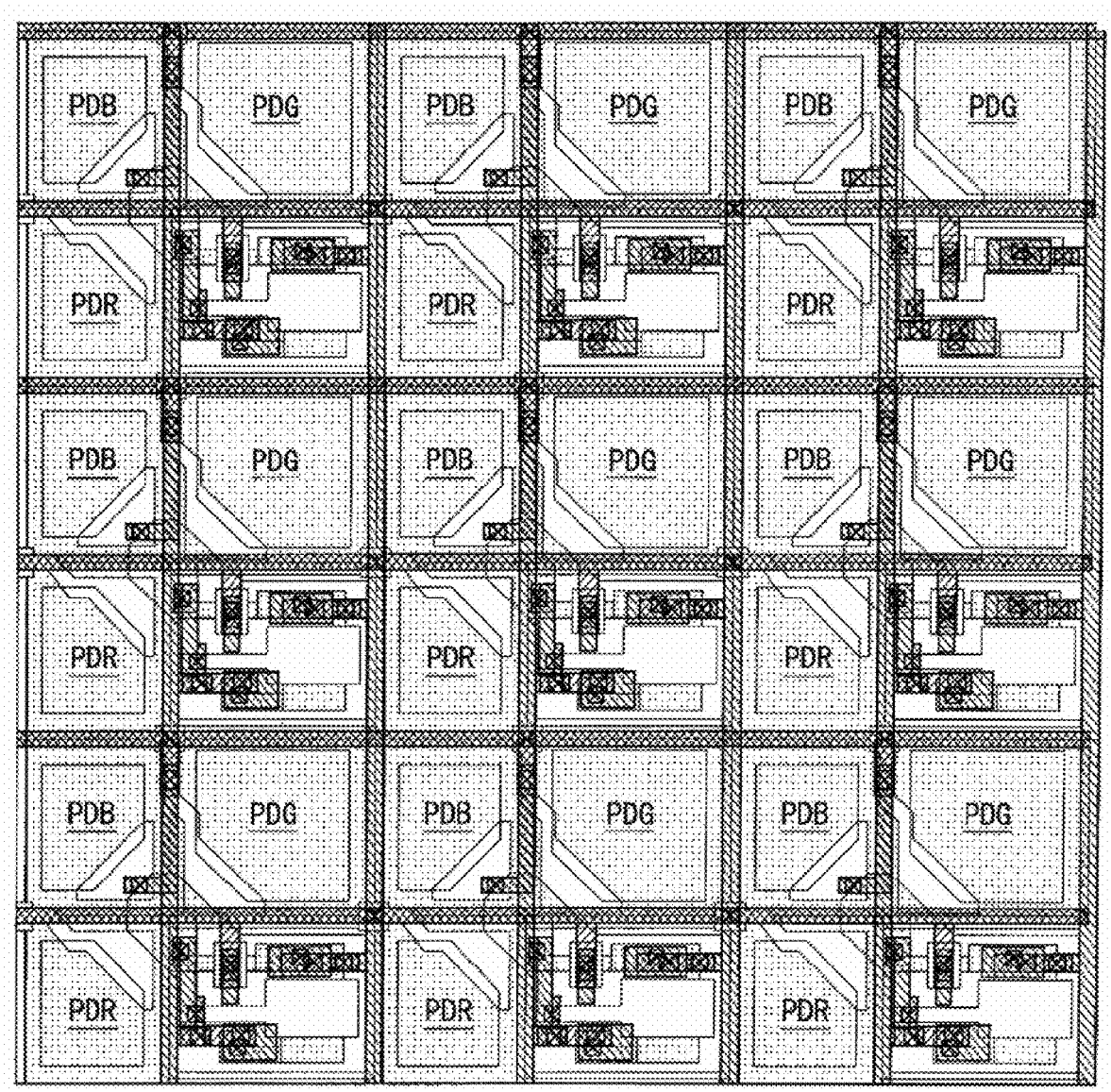
FIG. 9 is a schematic plan view illustrating a portion of pixel units of a third embodiment disposed in a square matrix shape.

FIG. 9 illustrates an example of a layout of a portion disposing the pixel unit of the third embodiment in a square matrix shape in three rows and three columns (an example of a layout of a portion disposing sections in six rows and six columns, representing by the unit section in the pixel unit).

A column alternately juxtaposing the green photodiode PDG and the transistor area and a column alternately juxtaposing the red photodiode PDR and the blue photodiode PDB are alternately juxtaposed along the row direction.

As the micro lens for the green photodiode PDG, for example, a large ellipsoidal micro lens extending to the adjacent transistor areas such as described in the second embodiment may be used. In this embodiment, however, the ellipsoidal shape is elongated along the column direction.

Figure 10:
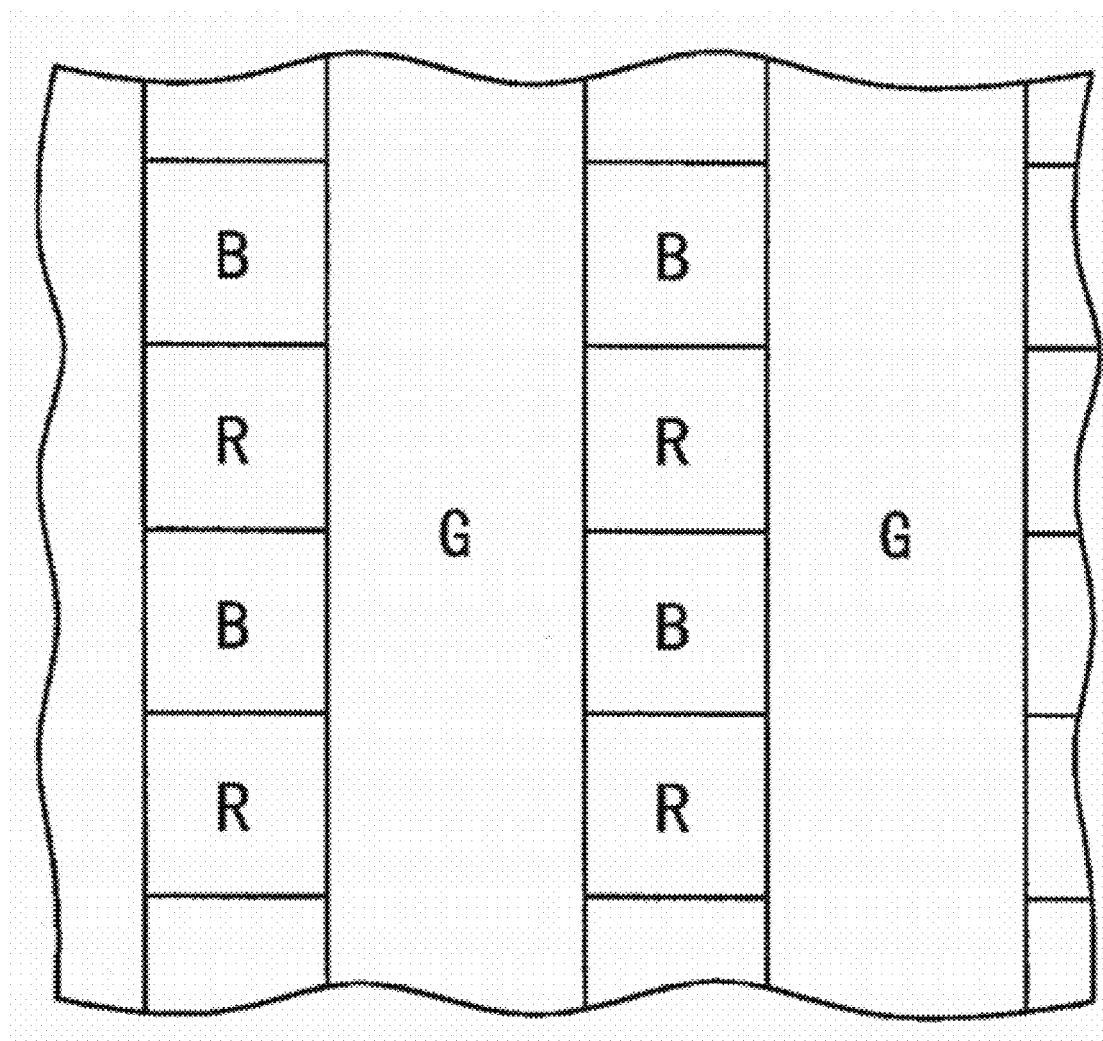
FIG. 10 is a schematic plan view illustrating a layout of color filters of the third embodiment.

As illustrated in FIG. 10, in the third embodiment, for example, a color filter layout may be adopted in which a column made of a single green filter and a column alternately juxtaposing a red filter and a blue filter are alternately juxtaposed along the row direction.

Next, with reference to FIGS. 11A to 11D, description will be made further on a wiring structure and the like, along with the manufacture sequence of the MOS type solid state image pickup device of the third embodiment.

Figure 11A:
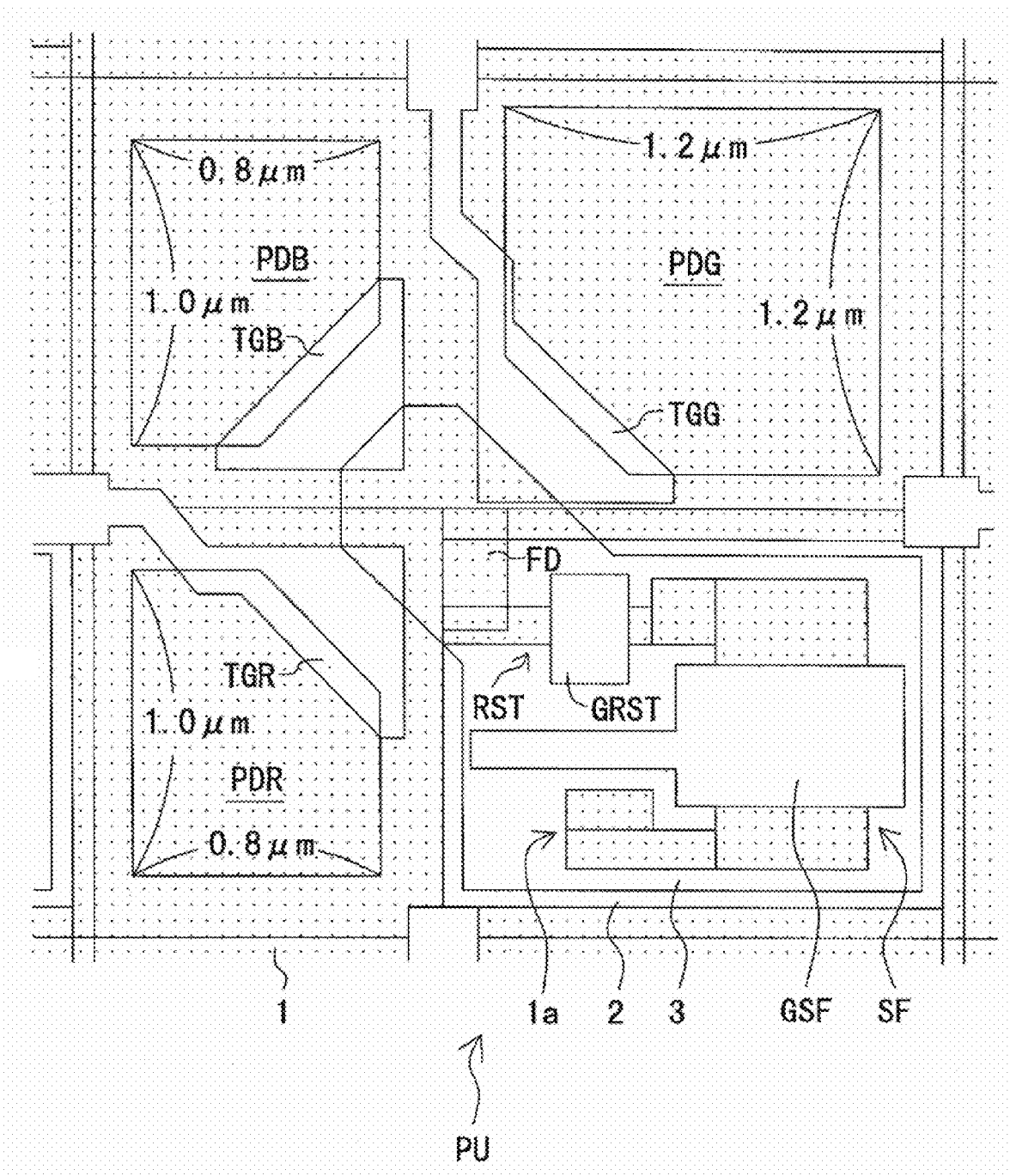
FIG. 11A is a schematic plan view illustrating a manufacture process for the MOS type solid state image pickup device of the third embodiment.

As illustrated in FIG. 11A, in the third embodiment, a green photodiode PDG, a red photodiode PDR and a blue photodiode PDB are disposed in the upper right, lower left and upper left sections of the pixel unit PU, respectively. Similar to the first embodiment, an area of the green photodiode PDG is, for example, 1.2 µm×1.2 µm, and an area of each of the red photodiode PDR and blue photodiode PDB is, for example, 0.8 µm×1.0 µm.

The transistor area is disposed in the lower right section. In the third embodiment, an area of the channel of a read transistor SF is 0.45 µm (length L in the source/drain direction)× 0.49 µm (width W) (=0.18 µm$^2$), resulting in an increase by about 140% from that of the comparative example.

In the first embodiment, the area of the channel of the transistor SF was 0.36 µm (length L)×0.49 µm (width W). In the third embodiment, a channel length L is longer than that of the first embodiment.

As understood from a comparison between, e.g., FIG. 11A of the third embodiment and FIG. 4A of the first embodiment, in the third embodiment, an n-type active region 1a is formed being connected to the source of the read transistor SF and protruding from the source along a direction crossing a direction of connecting the source and drain.

In the first embodiment, a contact is formed on the source, whereas in the third embodiment, a contact is formed on the protruded portion 1a. It is therefore easy to broaden the channel by elongating the gate electrode GSF along the length L direction.

Figure 11B:
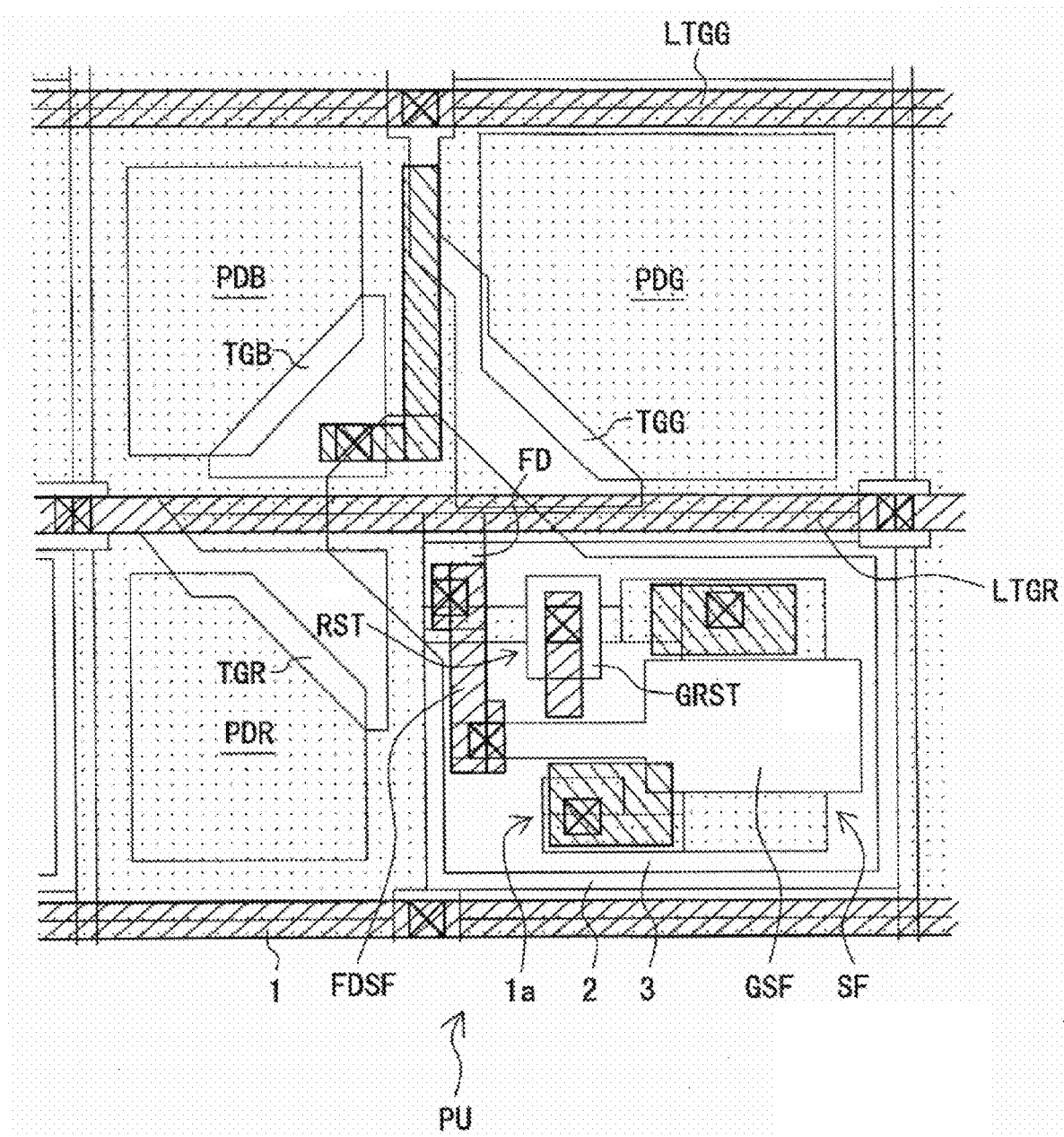
FIG. 11B is a schematic plan view illustrating a manufacture process following FIG. 11A for the MOS type solid state image pickup device of the third embodiment.

Next, as illustrated in FIG. 11B, formed in a first metal layer are a TGG line (LTGG) for supplying a transfer voltage pulse to a transfer gate electrode TGG and a TGR line (LTGR) for supplying a transfer voltage pulse to a transfer gate electrode TGR. The TGG line is disposed above the edge of the pixel unit PU along the row direction, and the TGR line is disposed above the border for partitioning the pixel unit PU along the column direction.

Also in the first metal layer, a connection line FDSF is formed for connection between the floating diffusion FD and the gate electrode GSF of the read transistor SF. Also formed are wiring portions necessary for connection to a second metal layer to be formed later.

Figure 11C:
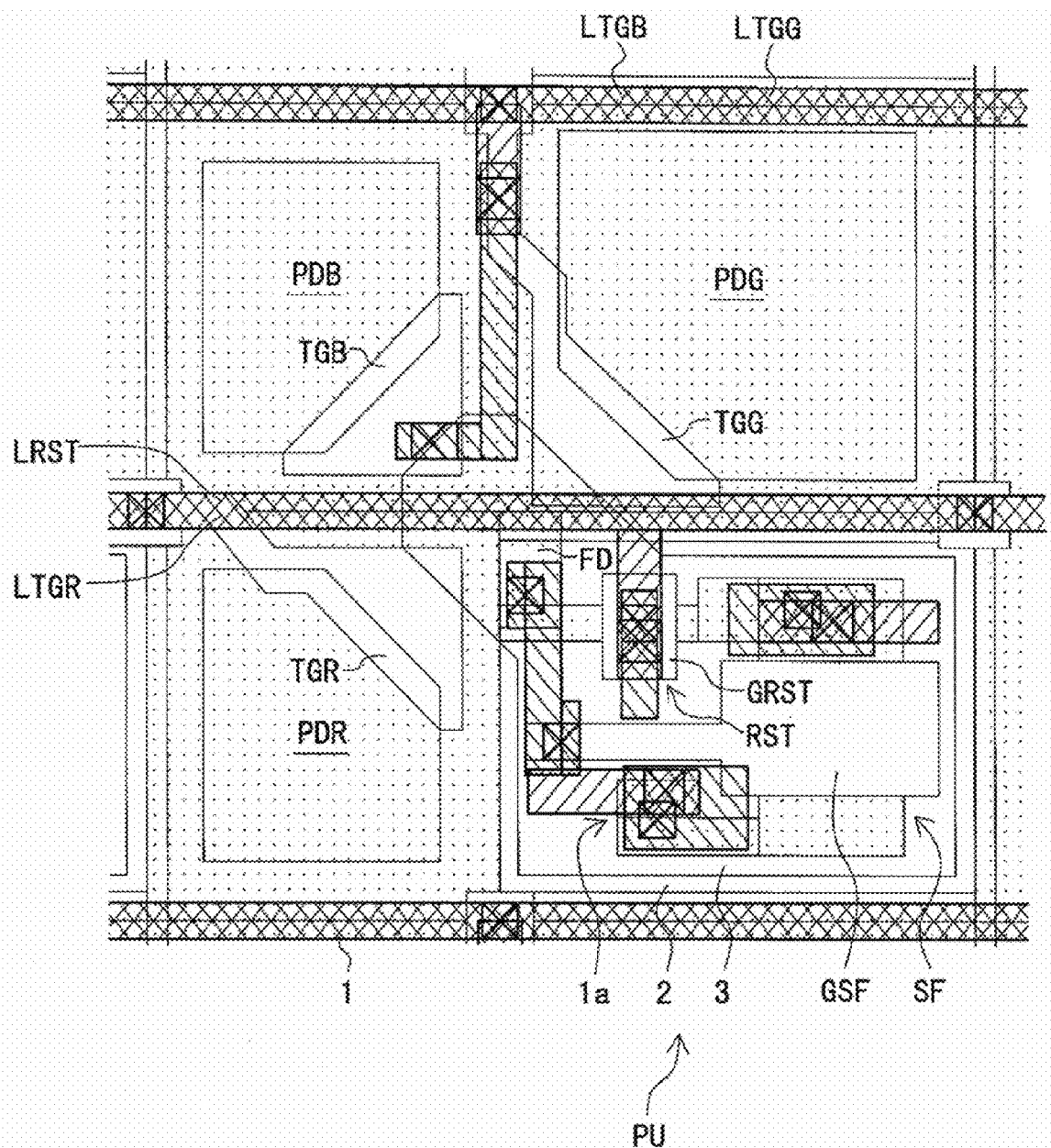
FIG. 11C is a schematic plan view illustrating a manufacture process following FIG. 11B for the MOS type solid state image pickup device of the third embodiment.

Next, as illustrated in FIG. 11C, formed in the second metal layer are a TGB line (LTGB) for supplying a transfer pulse voltage to a transfer gate electrode TGB and a reset line LRST for supplying a control voltage to a gate electrode GRST of a reset transistor RST. The TGB lines is disposed above the edge of the pixel unit PU along the row direction, and the reset line LRST is disposed above the border for partitioning the pixel unit PU along the column direction. Also formed are wiring portions necessary for connection to a third metal layer to be formed later.

The TGB line LTGB and RST line LRST are connected to the transfer gate electrode TGB and the gate electrode GRST of the reset transistor RST, respectively, via the wiring portions in the first metal layer.

Figure 11D:
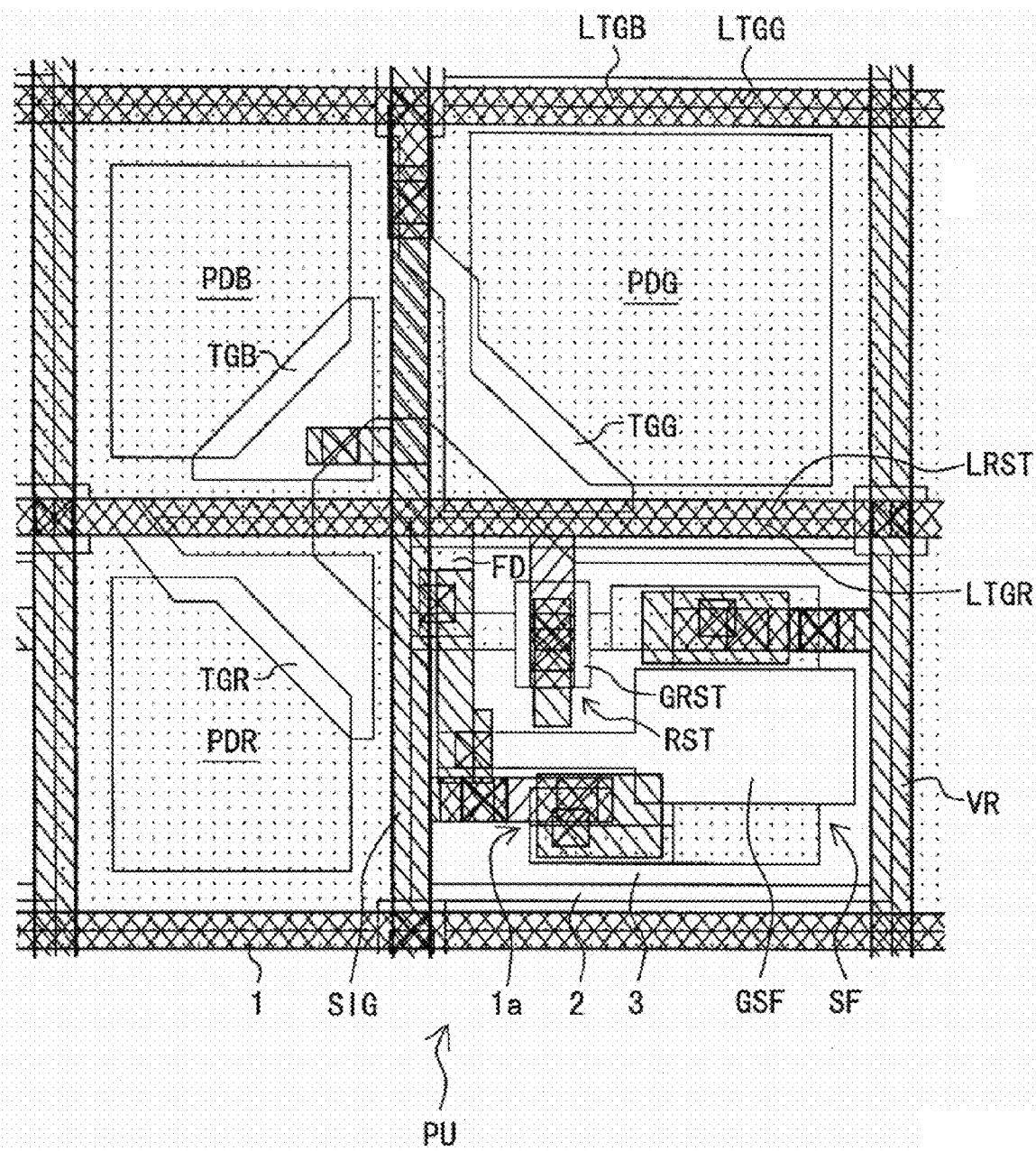
FIG. 11D is a schematic plan view illustrating a manufacture process following FIG. 11C for the MOS type solid state image pickup device of the third embodiment.

Next, as illustrated in FIG. 11D, formed in the third metal layer are a supply line VR for the power source voltage and a signal line SIG for picking up an output signal from the read transistor SF. The power source supply line VR is disposed above the edge of the pixel unit PU along the column direction, and the signal line SIG is disposed above the border for partitioning the pixel unit PU along the row direction.

The power source supply line VR and signal line SIG are connected to the drain and source of the read transistor SF, respectively, via the wiring portions of the first and second metal layers.

Next, a MOS type solid state image pickup device of the fourth embodiment will be described. Although the pixel unit has a rectangular shape (square shape) in the first to third embodiment, the shape of the pixel unit is not limited to the rectangular shape (square shape).

The shape of the pixel unit of the fourth embodiment is a crank shape in which the row alternately juxtaposing the green photodiode PDG and transistor area in the pixel unit of the first embodiment is shifted along the row direction relative to the row alternately juxtaposing the red photodiode and blue photodiode PDB. A shift pitch along the row direction is, for example, a half of the length of one section of the pixel unit along the row direction.

Figure 12:
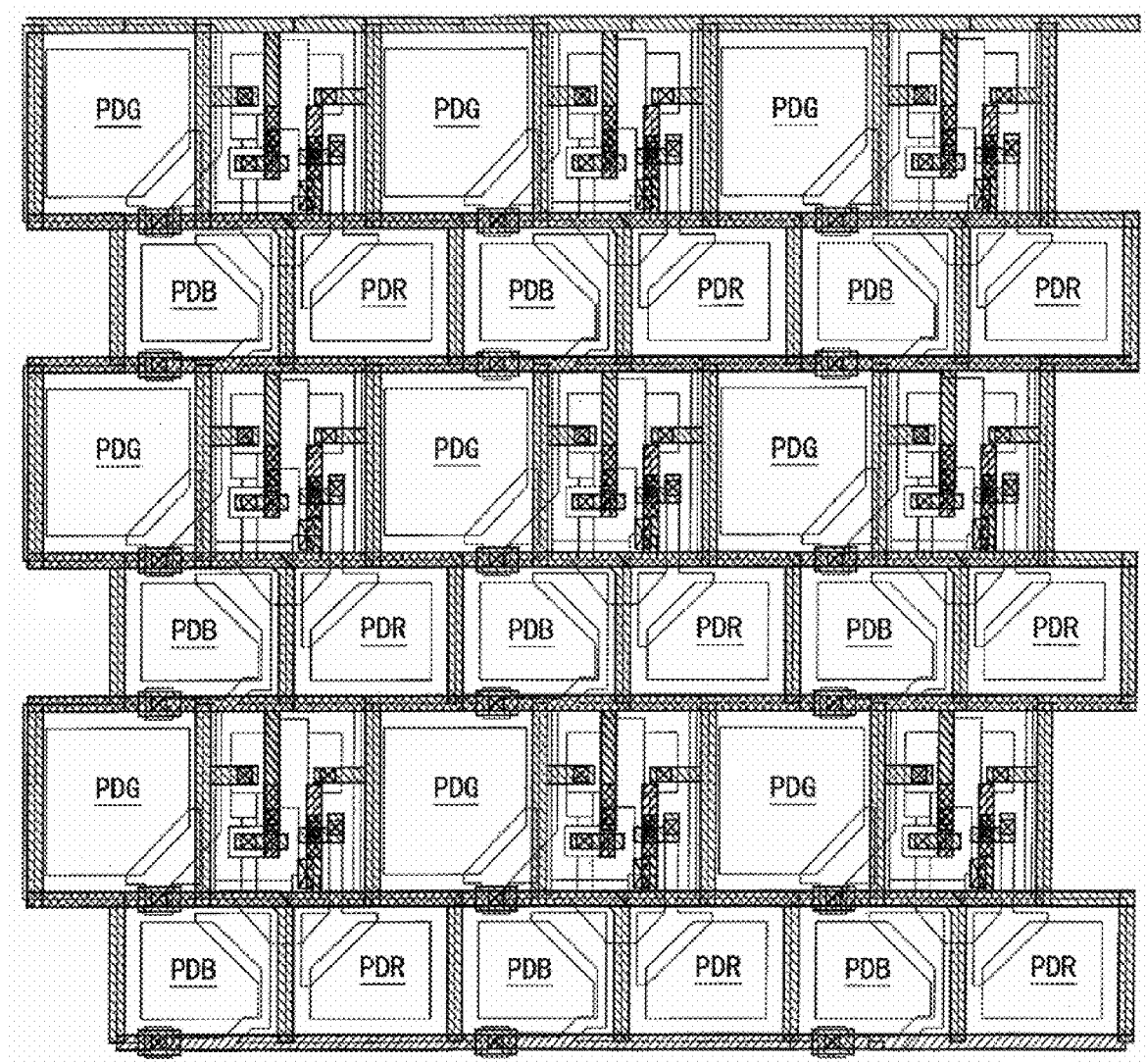
FIG. 12 is a schematic plan view illustrating a portion of pixel units of a fourth embodiment disposed in a square matrix shape.

FIG. 12 illustrates an example of a layout of a portion disposing the pixel unit of the fourth embodiment in a square matrix shape in three rows and three columns (an example of a layout of a portion disposing sections in six rows and six columns, representing by the unit section in the pixel unit).

Similar to the first embodiment (refer to FIG. 2), even if the pixel unit of this shape is adopted, a row alternately juxtaposing a green photodiode PDG and a transistor area and a row alternately juxtaposing a red photodiode PDR and a blue photodiode PDB are alternately juxtaposed along the column direction.

Similar to the first embodiment (refer to FIG. 3), for example, the color filters may take an arrangement that a row of a single green filter and a row alternately juxtaposing a red filter and blue filter are alternately juxtaposed along the column direction.

Next, with reference to FIGS. 13A to 13C, description will be made further on a wiring structure and the like, along with the manufacture sequence of the MOS type solid state image pickup device of the fourth embodiment.

Figure 13A:
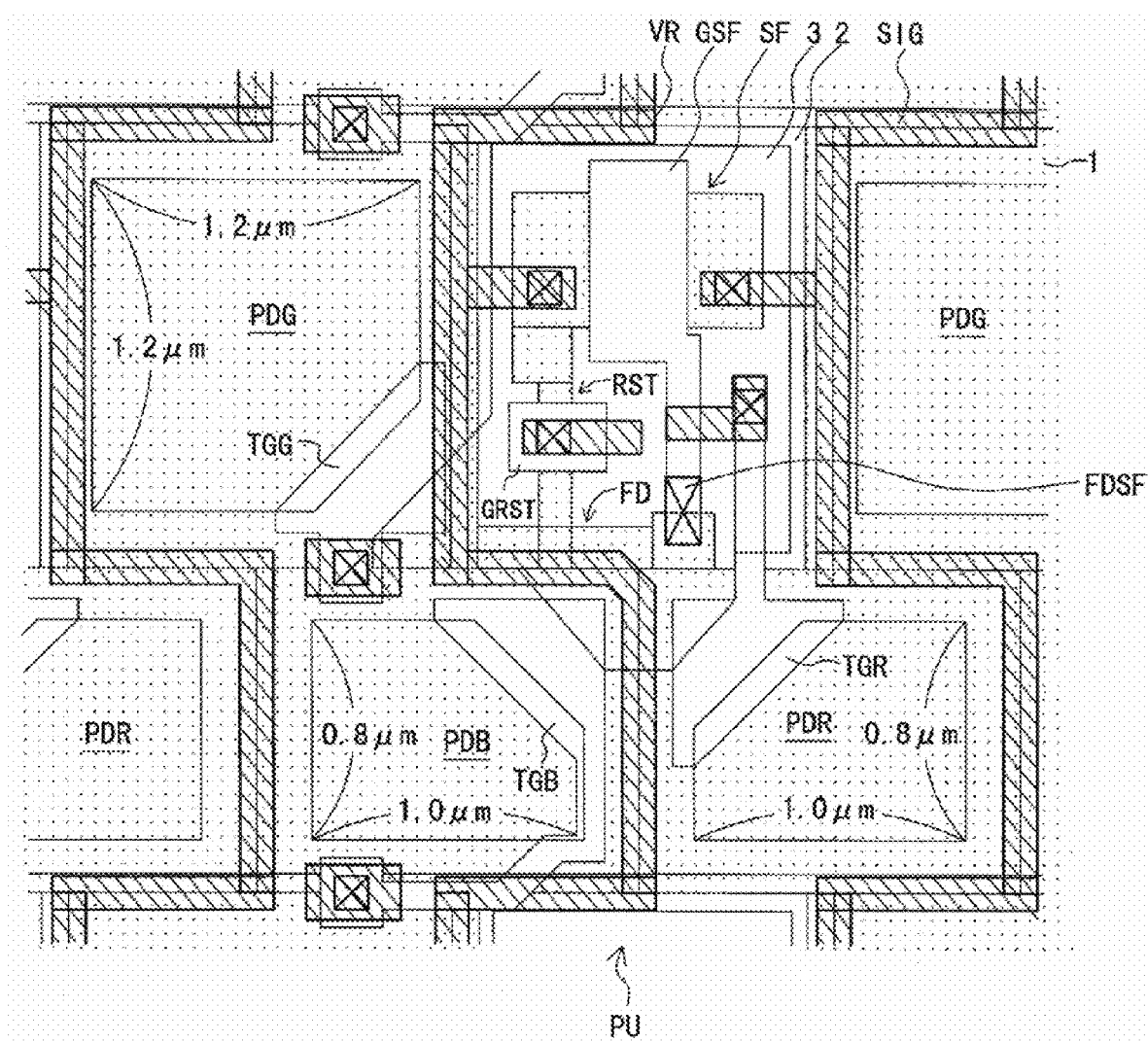
FIG. 13A is a schematic plan view illustrating a manufacture process for the MOS type solid state image pickup device of the fourth embodiment.

As illustrated in FIG. 13A, a first metal layer is formed. Similar to the first embodiment, formed in the first metal layer are a signal line SIG, a power source voltage supply line VR, and a connection line FDSF between a floating diffusion FD and a gate electrode GSF of a read transistor SF Similar to the first embodiment, the signal line SIG and power source voltage supply line VR are wirings extending along the column direction. However, since the pixel unit has the crank shape, the edge of the pixel unit PU along the column direction and the border for partitioning the pixel unit PU along the row direction are flexed in a crank shape. The signal line SIG and power source voltage supply line VR of the fourth embodiment are disposed above such an edge and border, and wired in a zigzag shape.

Figure 13B:
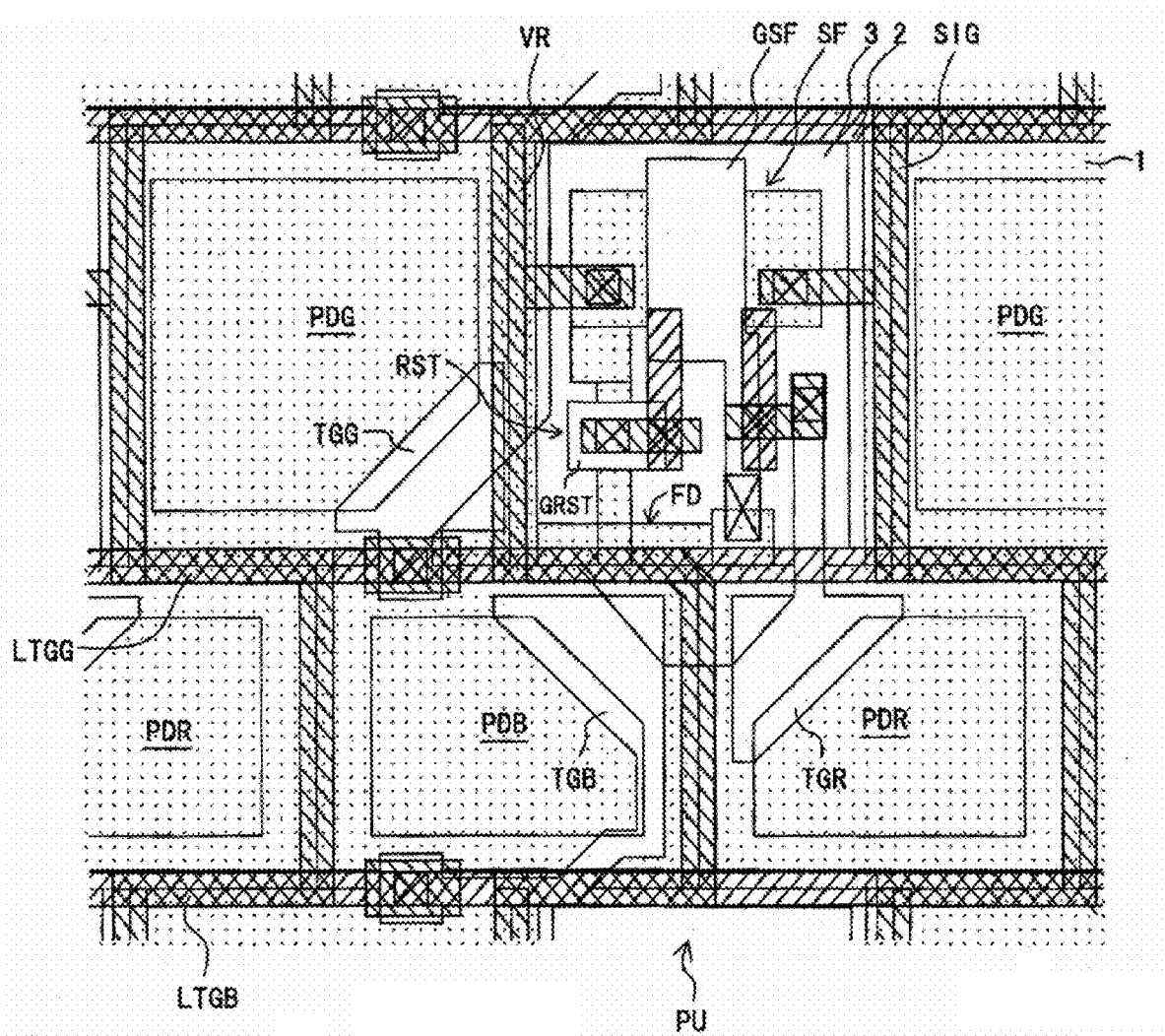
FIG. 13B is a schematic plan view illustrating a manufacture process following FIG. 13A for the MOS type solid state image pickup device of the fourth embodiment.
Figure 13C:
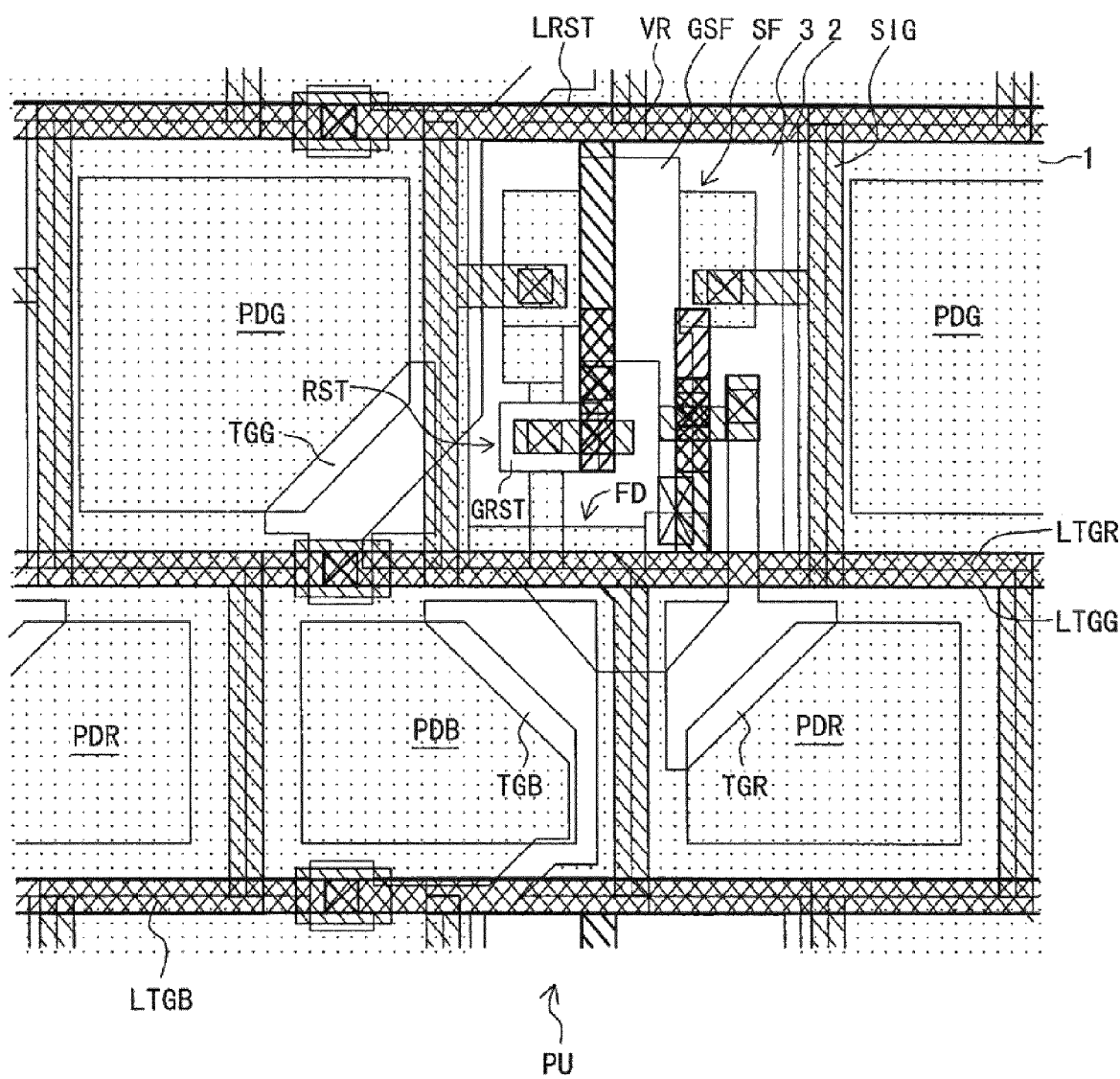
FIG. 13C is a schematic plan view illustrating a manufacture process following FIG. 13B for the MOS type solid state image pickup device of the fourth embodiment.

Next, as illustrated in FIGS. 13B and 13C, second and third metal layers are formed. In the fourth embodiment, a TGB line (LTGB) and a TGG line (LTGG) are formed in the second metal layer, and a reset line LRST and a TGR line (LTGR) are formed in the third metal layer.

An edge and a border along the row direction are straightforward. The TGB line and reset line LRST are disposed above the edges of the pixel unit PU along the row direction, and the TGG line and TGR line are disposed above the border for partitioning the pixel unit PU along the column direction.

For the layout of the third embodiment, a column juxtaposing the green photodiode PDG and transistor area may be shifted along the column direction relative to the column juxtaposing the red photodiode PDR and blue photodiode PDB.

The MOS type solid state image pickup device described in the first to fourth embodiments may be mounted on a portable electronic apparatus such as a mobile phone.

Figure 14:
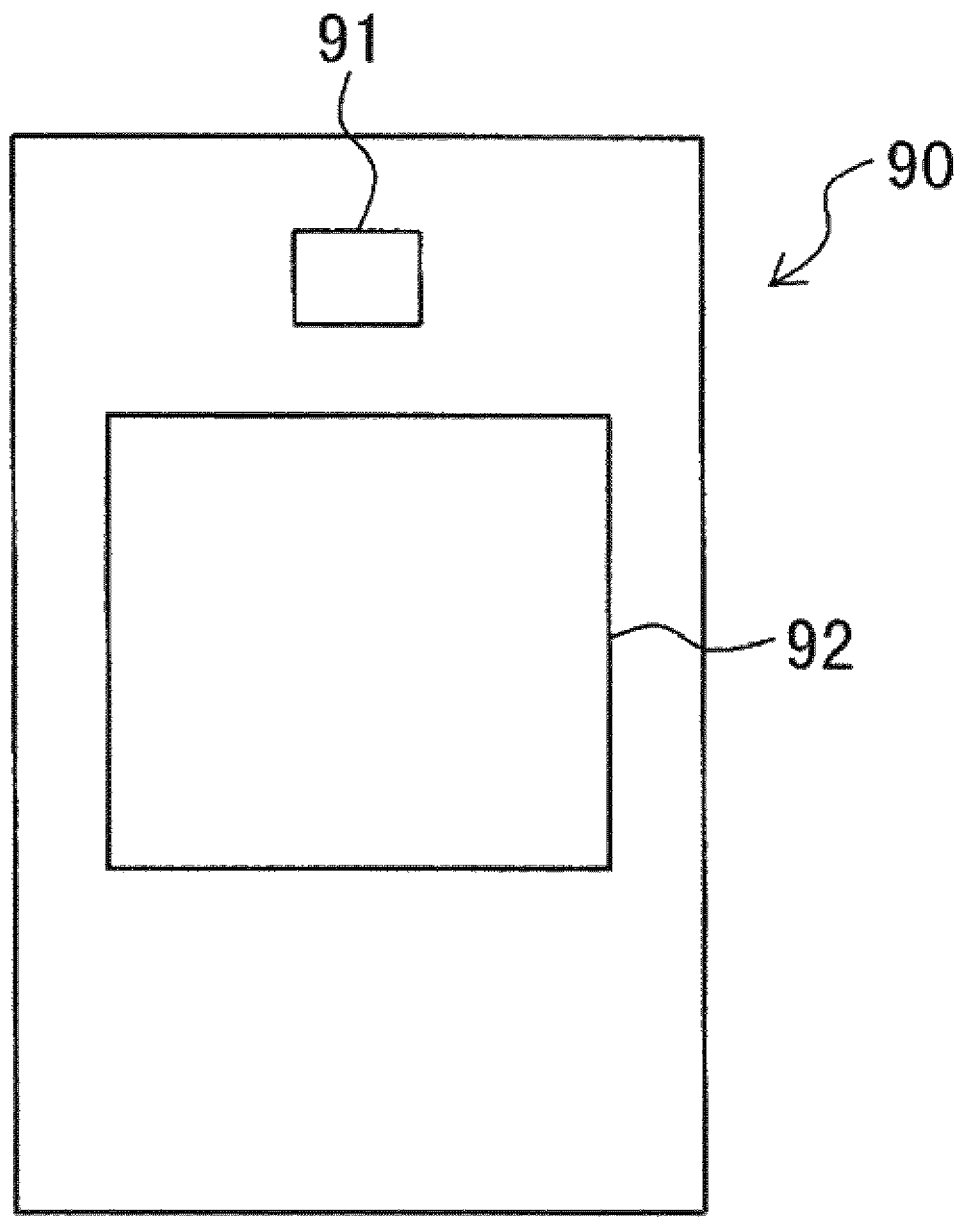
FIG. 14 is a diagram illustrating an example of a portable electronic apparatus mounting a MOS type solid state image pickup device of any one of the first to fourth embodiment.

FIG. 14 is a diagram illustrating an example of a portable electronic apparatus mounting the MOS type solid state image pickup device of the above-described embodiment. A portable electronic apparatus 90 is equipped with a MOS type solid state image pickup device 91 of the above-described embodiment and a display 92 for displaying an image photographed with the image pickup device 91.

In the first to fourth embodiments, the layout of red (R) and blue (B) may be exchanged.

Although three primary colors, red (R), green (G) and blue (B), are arranged in the pixel unit of the first to fourth embodiments, three colors of red (R), white (W) replacing green (G), and blue (B) may be arranged. In this case, the position of a white photodiode is preferably the position of the green photodiode having the largest size. A transparent and colorless filter may be used for the white photodiode.

Instead of three primary colors of red (R), green (G) and blue (B), complementary colors of cyan (Cy), magenta (Mg) and yellow (Ye) may be used. In this case, a photodiode of any color may have a largest size.

In the above-described embodiments, a MOS type solid state image pickup device may be formed by exchanging the p- and n-type conductivity types.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a plurality of pixel units disposed in a matrix shape, each of said plurality of pixel units including:
a first photoelectric conversion element for converting incident light of a first color into signal charges;
a second photoelectric conversion element for converting incident light of a second color into signal charges;
a third photoelectric conversion element for converting incident light of a third color into signal charges; and
a detector circuit shared by said first to third photoelectric conversion elements for detecting said signal charges converted by each of said first to third photoelectric conversion elements,
wherein said plurality of pixel units are pixel units adjacently disposing a row juxtaposing said first photoelectric conversion element and said detector circuit and a row juxtaposing said second photoelectric conversion element and said third photoelectric conversion element, or pixel units adjacently disposing a column juxtaposing said first photoelectric conversion element and said detector circuit and a column juxtaposing said second photoelectric conversion element and said third photoelectric conversion element.

2. The semiconductor device according to claim 1, wherein an area of said first photoelectric conversion element is broader than an area of each of said second and third photoelectric conversion elements.

3. The semiconductor device according to claim 1, wherein if said first photoelectric conversion element and said detector circuit are juxtaposed in a row direction, a width of said first photoelectric conversion element along a column direction is wider than a width of said second photoelectric conversion element along said column direction and a width of said third photoelectric conversion element along said column direction, or if said first photoelectric conversion element and said detector circuit are juxtaposed in a column direction, a width of said first photoelectric conversion element along a row direction is wider than a width of said second photoelectric conversion element along said row direction and a width of said third photoelectric conversion element along said row direction.

4. The semiconductor device according to claim 1, further comprising a first micro lens formed above said first photoelectric conversion element and making light be incident upon said first photoelectric conversion element, and said first micro lens is formed in such a manner that said first micro lens has a portion superposed upon said detector circuit adjacent to said first photoelectric conversion element.

5. The semiconductor device according to claim 4, wherein said first micro lens has an ellipsoidal shape elongated along a direction of disposing said first photoelectric conversion element and said detector circuit.

6. The semiconductor device according to claim 1, further comprising first to third micro lenses formed above said first to third photoelectric conversion elements respectively and making light be incident upon said first to third photoelectric conversion elements, and an area of said first micro lens is broader than an area of each of said second and third micro lenses.

7. The semiconductor device according to claim 1, wherein said plurality of pixel units alternately juxtaposing said first photoelectric conversion element and said detector circuit along a row or column direction.

8. The semiconductor device according to claim 7, wherein said plurality of pixel units alternately juxtapose said second photoelectric conversion element and said detector circuit along said column direction if said first photoelectric conversion element and said detector circuit are alternately juxtaposed along said row direction, or alternately juxtapose said second photoelectric conversion element and said detector circuit along said row direction if said first photoelectric conversion element and said detector circuit are alternately juxtaposed along said column direction.

9. The semiconductor device according to claim 1, wherein:
said plurality of pixel units are pixel units alternately juxtaposing said first photoelectric conversion element and said detector circuit along a row direction and alternately juxtaposing said second photoelectric conversion element and said detector circuit along a column direction, or pixel units alternately juxtaposing said first photoelectric conversion element and said detector circuit along said column direction and alternately juxtaposing said second photoelectric conversion element and said detector circuit along said row direction; and
the semiconductor device further comprises first and second micro lenses formed above said first and second photoelectric conversion elements respectively and making light be incident upon said first and second photoelectric conversion elements, said first micro lens is formed in such a manner that said first micro lens has a portion superposed upon said detector circuit adjacent to said first photoelectric conversion element, and said second micro lens is also formed in such a manner that said second micro lens has a portion superposed upon said detector circuit adjacent to said second photoelectric conversion element.

10. The semiconductor device according to claim 1, wherein said detector circuit comprises:
a floating diffusion to which said signal charges converted by each of said first to third photoelectric conversion elements are transferred;
a read transistor of a MOS transistor including source/drain regions and a gate electrode, said gate electrode being electrically connected to said floating diffusion;
an active region connected to said source/drain region of said read transistor and projecting in a direction crossing a direction of connecting said source/drain regions of said read transistor; and
a contact member formed on said active region.

11. The semiconductor device according to claim 1, wherein said detector circuit comprises:
a floating diffusion to which said signal charges converted by each of said first to third photoelectric conversion elements are transferred; and a read transistor of a MOS transistor including source/drain regions and a gate electrode, said gate electrode being electrically connected to said floating diffusion,
wherein a select transistor is not provided.

12. The semiconductor device according to claim 2, wherein said first color is green, said second color is one of red and blue, and said third color is the other of red and blue.

13. A semiconductor device having a pixel unit, said pixel unit comprising:
a first photoelectric conversion element for converting incident light of a first color into signal charges;
a second photoelectric conversion element for converting incident light of a second color into signal charges;
a third photoelectric conversion element for converting incident light of a third color into signal charges; and a detector circuit shared by said first to third photoelectric conversion elements for detecting said signal charges converted by each of said first to third photoelectric conversion elements, wherein said first photoelectric conversion element and said detector circuit are disposed being juxtaposed along a first direction;

said second photoelectric conversion element and said third photoelectric conversion element are disposed being juxtaposed along said first direction and adjacent to an array of said first photoelectric conversion element and said detector circuit;

said second photoelectric conversion element and said detector circuit are disposed being juxtaposed along a second direction crossing said first direction; and said first photoelectric conversion element and said third photoelectric conversion element are disposed being juxtaposed along said second direction and adjacent to an array of said second photoelectric conversion element and said detector circuit.

14. The semiconductor device according to claim 13, wherein an area of said first photoelectric conversion element is broader than an area of each of said second and third photoelectric conversion elements.

15. The semiconductor device according to claim 14, wherein said first color is green, said second color is one of red and blue, and said third color is the other of red and blue.

16. A portable electronic apparatus mounting a semiconductor device, said semiconductor device comprising:

a plurality of pixel units disposed in a matrix shape, each of said plurality of pixel units including:

a first photoelectric conversion element for converting incident light of a first color into signal charges;

a second photoelectric conversion element for converting incident light of a second color into signal charges;

a third photoelectric conversion element for converting incident light of a third color into signal charges; and a detector circuit shared by said first to third photoelectric conversion elements for detecting said signal charges converted by each of said first to third photoelectric conversion elements, wherein said plurality of pixel units are pixel units adjacently disposing a row juxtaposing said first photoelectric conversion element and said detector circuit and a row juxtaposing said second photoelectric conversion element and said third photoelectric conversion element, or pixel units adjacently disposing a column juxtaposing said first photoelectric conversion element and said detector circuit and a column juxtaposing said second photoelectric conversion element and said third photoelectric conversion element.

* * * * *